US008884318B2

(12) United States Patent
Lee et al.

(10) Patent No.: US 8,884,318 B2
(45) Date of Patent: Nov. 11, 2014

(54) SEMICONDUCTOR LIGHT EMITTING DEVICE HAVING MULTI-CELL ARRAY, LIGHT EMITTING MODULE, AND ILLUMINATION APPARATUS

(75) Inventors: Su Yeol Lee, Gyunggi-do (KR); Yong Tae Kim, Gyunggi-do (KR); Jin Bock Lee, Gyunggi-do (KR); Gi Bum Kim, Gyunggi-do (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 185 days.

(21) Appl. No.: 13/034,279

(22) Filed: Feb. 24, 2011

(65) Prior Publication Data
US 2011/0210352 A1     Sep. 1, 2011

(30) Foreign Application Priority Data

Feb. 27, 2010    (KR) ........................ 10-2010-0018277

(51) Int. Cl.
| H01L 33/08 | (2010.01) |
| H01L 23/00 | (2006.01) |
| H01L 27/15 | (2006.01) |
| H01L 33/30 | (2010.01) |
| H01L 33/62 | (2010.01) |

(52) U.S. Cl.
CPC ..... *H01L 27/156* (2013.01); *H01L 2224/48091* (2013.01); *H01L 24/24* (2013.01); *H01L 33/30* (2013.01); *H01L 33/62* (2013.01); *H01L 27/153* (2013.01)
USPC .. 257/93; 257/88; 257/E33.005; 257/E21.511

(58) Field of Classification Search
None
See application file for complete search history.

(56) References Cited

U.S. PATENT DOCUMENTS

| 5,307,089 | A * | 4/1994 | Takasu et al. ................. 347/238 |
| 6,547,249 | B2 | 4/2003 | Collins, III et al. |
| 6,842,360 | B1 | 1/2005 | Srinivasan |
| 7,285,801 | B2 * | 10/2007 | Eliashevich et al. ............ 257/96 |
| 2005/0253155 | A1 * | 11/2005 | Wirth ............................... 257/88 |
| 2007/0284598 | A1 | 12/2007 | Shakuda et al. |
| 2008/0179602 | A1 * | 7/2008 | Negley et al. ................... 257/88 |
| 2009/0023041 | A1 | 1/2009 | Cooper |

FOREIGN PATENT DOCUMENTS

| CN | 101601135 A | 12/2009 |
| EP | 1 596 442 A2 | 11/2005 |
| JP | 8-137413 A | 5/1996 |
| JP | 2009-296013 | 12/2009 |

(Continued)

OTHER PUBLICATIONS

Extended European Search Report, issued in European Patent Application No. EP 11 15 6194, dated Jul. 1, 2011.

(Continued)

*Primary Examiner* — Johannes P Mondt
(74) *Attorney, Agent, or Firm* — McDermott Will & Emery LLP

(57) ABSTRACT

A semiconductor light emitting device includes a substrate; a plurality of light emitting cells disposed on the top surface of the substrate, the light emitting cells each having an active layer; a plurality of connection parts formed on the substrate with the light emitting cells formed thereon to connect the light emitting cells in a parallel or series-parallel configuration; and an insulation layer formed on the surface of the light emitting cell to prevent an undesired connection between the connection parts and the light emitting cell. The light emitting cells comprise at least one defective light emitting cell, and at least one of the connection parts related to the defective light emitting cell is disconnected.

25 Claims, 19 Drawing Sheets

(56) References Cited

FOREIGN PATENT DOCUMENTS

| | | |
|---|---|---|
| KR | 10-0642785 | 11/2006 |
| KR | 10-2007-0023950 A | 3/2007 |
| TW | M270492 U | 7/2005 |
| TW | 200539490 A | 12/2005 |
| TW | I288487 | 10/2007 |
| WO | WO 01/56000 A2 | 8/2001 |
| WO | WO 2008/062941 A1 | 5/2008 |
| WO | WO 2008/091837 A2 | 7/2008 |
| WO | WO-2008/091846 A2 | 7/2008 |
| WO | WO 2009/055079 A1 | 4/2009 |

OTHER PUBLICATIONS

Taiwanese Office Action, w/ English translation thereof, issued in Taiwanese Patent Application No. TW 100104243 dated Jun. 13, 2013.

Chinese Office Action, w/ English translation thereof, issued in Chinese Patent Application No. CN 201110053375.0 dated Feb. 4, 2013.

* cited by examiner

SEMICONDUCTOR LIGHT EMITTING DEVICE HAVING MULTI-CELL ARRAY, LIGHT EMITTING MODULE, AND ILLUMINATION APPARATUS

CROSS-REFERENCE TO RELATED APPLICATIONS

This application claims the priority of Korean Patent Application No. 10-2010-0018277 filed on Feb. 27, 2010, in the Korean Intellectual Property Office, the disclosure of which is incorporated herein by reference.

BACKGROUND OF THE INVENTION

1. Field of the Invention

The present invention relates to a semiconductor light emitting device, and more particularly, to a semiconductor light emitting device having an array of light emitting cells, a light emitting module including the semiconductor light emitting device, and an illumination apparatus including the light emitting module.

2. Description of the Related Art

In general, semiconductor light emitting diodes (LEDs) are advantageous for light sources in terms of power, efficiency and reliability. Therefore, semiconductor LEDs are being actively developed as high-power, high-efficiency light sources for various illumination apparatuses as well as for backlight units of display devices.

For the commercialization of such semiconductor LEDs as illumination light sources, it is necessary to increase their light efficiency and reduce their production cost while increasing their power to a desired level.

However, a high-power LED using a high-rated current may have low light efficiency due to a high current density, when compared to a low-power LED using a low-rated current.

Specifically, if a rated current is increased to obtain high luminous flux in an LED chip of the same area in order to obtain high power, the light efficiency may be degraded due to an increase in the current density. Also, the light efficiency degradation is accelerated due to heat generated by the device.

SUMMARY OF THE INVENTION

An aspect of the present invention provides a semiconductor light emitting device that improves a current density per unit area to improve the light efficiency thereof and process a defective light emitting cell effectively.

Another aspect of the present invention provides a semiconductor light emitting device that improves a current density per unit area to improve the light efficiency thereof, implement a uniform current distribution and minimize a decrease in the number of effective light emitting cells in processing a defective light emitting cell.

Another aspect of the present invention provides a semiconductor light emitting device that improves a current density per unit area to improve the light efficiency thereof and implement an improved connection structure between light emitting cells that enables easy implementation of various interconnection structures.

Another aspect of the present invention provides a light emitting module including the above semiconductor light emitting device and an illumination apparatus including the light emitting module.

According to an aspect of the present invention, there is provided a semiconductor light emitting device including: a substrate; a plurality of light emitting cells disposed on the top surface of the substrate, the light emitting cells each having a first-conductivity-type semiconductor layer, an active layer, and a second-conductivity-type semiconductor layer formed sequentially on the top surface of the substrate, wherein a region between the light emitting cells is defined as an isolation region removed to at least the active layer; a plurality of connection parts formed on the substrate with the light emitting cells formed thereon to connect the light emitting cells in a parallel or series-parallel configuration; and an insulation layer formed on the surface of the light emitting cell to prevent an undesired connection between the connection parts and the light emitting cell, wherein the light emitting cells include at least one defective light emitting cell, and at least one of the connection parts related to the defective light emitting cell is disconnected.

The light emitting cells may be arrayed in a plurality of columns each having two or more light emitting cells; and the connection part may include: a first connection part connected to the first-conductivity-type semiconductor layer of the light emitting cell located at one end of each column; a second connection part connected to the second-conductivity-type semiconductor layer of the light emitting cell located at the other end of each column; and an interconnection part formed to connect the light emitting cells of each column in series to each other between the first connection part and the second connection part.

The columns may have the same number of light emitting cells disposed therein.

The connection part may further include an intermediate connection part formed to connect the interconnection part of at least a portion of the columns in a row direction.

The light emitting cells may be M×N light emitting cells arrayed in M rows and M columns on the substrate, M and N being integers equal to or greater than 2; and the light emitting cells in each column may be formed such that the opposite polarities thereof face each other.

The intermediate connection part may have various configurations. The intermediate connection part may include an intermediate connection part formed to connect all of the N columns. The intermediate connection part may include a plurality of intermediate connection parts formed in one row direction to connect a portion of the N columns. The intermediate connection part may include a plurality of intermediate connection parts formed along a plurality of different row directions.

The connection part may include: at least one first connection part connected to the first-conductivity-type semiconductor layer of the light emitting cells; and at least one second connection part connected to the second-conductivity-type semiconductor layer of the light emitting cells.

The connection part may further include: a plurality of first interconnection parts connecting the first connection part and the first-conductivity-type semiconductor layer of each light emitting cell; and a plurality of second interconnection parts connecting the second connection part and the second-conductivity-type semiconductor layer of each light emitting cell.

The light emitting cells may be M ×N light emitting cells arrayed in M rows and N columns on the substrate, M and N being integers equal to or greater than 2; and the light emitting cells in each column may be formed such that the electrodes of the same polarity face each other.

The first connection part may include at least one first intermediate connection part formed between the adjacent rows and connected to the semiconductor layers of the same conductivity type of the light emitting cells located at both sides opposite to each other; and the second connection part includes at least one second intermediate connection part formed between the adjacent rows and connected to the semiconductor layers of the same conductivity type of the light emitting cells located at both sides opposite to each other.

The light emitting cells may be arrayed in M rows and M columns, M and N being integers equal to or greater than 4; M light emitting cells located in each column may be divided into a plurality of groups each having two or more light emitting cells connected in series to each other, and the light emitting cells of the groups may be formed such that the electrodes of the same polarity face each other in the light emitting cells of the adjacent groups. The connection part may include: at least one first connection part connected to the first-conductivity-type semiconductor layer of the light emitting cell located at one end of each group; at least one second connection part connected to the second-conductivity-type semiconductor layer of the light emitting cell located at the other end of each group; and a series interconnection part formed to connect the light emitting cells of the groups in series to each other.

The groups may include the same number of light emitting cells.

The connection part may further include: a plurality of first interconnection parts connecting the first connection part and the first-conductivity-type semiconductor layer of each light emitting cell; and a plurality of second interconnection parts connecting the second connection part and the second-conductivity-type semiconductor layer of each light emitting cell. The first connection part may include at least one first intermediate connection part formed between the adjacent rows and connected to the semiconductor layers of the same conductivity type of the light emitting cells located at both sides opposite to each other; and the second connection part may include at least one second intermediate connection part formed between the adjacent rows and connected to the semiconductor layers of the same conductivity type of the light emitting cells located at both sides opposite to each other.

The semiconductor light emitting device may further include: at least one first bonding pad formed directly on the substrate to be connected to the first connection part; and at least one second bonding pad formed directly on the substrate to be connected to the second connection part.

The isolation region may include a region exposing the substrate. The isolation region may include a region exposing the first-conductivity-type semiconductor layer.

The insulation layer may be provided as a passivation layer formed on the side surfaces of the light emitting cells.

The light emitting cell may have various sectional shapes. For example, the light emitting cell may have a polygonal, circular or parallelogrammic section.

The present invention also provides various schemes for reducing the number of normal light emitting cells wasted when removing the connection part related to a defective light emitting cell.

According to another aspect of the present invention, there is provided a semiconductor light emitting device including: a substrate; a plurality of light emitting cells disposed on the top surface of the substrate, the light emitting cells each having a first-conductivity-type semiconductor layer, an active layer, and a second-conductivity-type semiconductor layer formed sequentially on the top surface of the substrate, the light emitting cells being arrayed in a plurality of columns having two or more light emitting cells; a plurality of connection parts formed on the substrate with the light emitting cells formed thereon to connect the light emitting cells in a series-parallel configuration; and an insulation layer formed on the surface of the light emitting cell to prevent an undesired connection between the connection parts and the light emitting cell.

Herein, the connection part may include: a first connection part connected to the first-conductivity-type semiconductor layer of the light emitting cell located at one end of each column; a second connection part connected to the second-conductivity-type semiconductor layer of the light emitting cell located at the other end of each column; an interconnection part formed to connect the light emitting cells of each column in series to each other between the first connection part and the second connection part; and an intermediate connection part formed to connect the interconnection part of at least a portion of the columns in a row direction.

According to another aspect of the present invention, there is provided a semiconductor light emitting device including: a substrate; a plurality of light emitting cells disposed on the top surface of the substrate, the light emitting cells each having a first-conductivity-type semiconductor layer, an active layer, and a second-conductivity-type semiconductor layer formed sequentially on the top surface of the substrate; a plurality of connection parts formed on the substrate with the light emitting cells formed thereon to connect the light emitting cells in a parallel configuration; and an insulation layer formed on the surface of the light emitting cell to prevent an undesired connection between the connection parts and the light emitting cell.

Herein, the connection part may include: at least one first connection part connected to the first-conductivity-type semiconductor layer of the light emitting cells; and at least one second connection part connected to the second-conductivity-type semiconductor layer of the light emitting cells.

According to another aspect of the present invention, there is provided a semiconductor light emitting device including: a substrate; a plurality of light emitting cells disposed on the top surface of the substrate, the light emitting cells each having a first-conductivity-type semiconductor layer, an active layer, and a second-conductivity-type semiconductor layer formed sequentially on the top surface of the substrate, the light emitting cells being arrayed in M rows and M columns, M and N being integers equal to or greater than 4; a plurality of connection parts formed on the substrate with the light emitting cells formed thereon to connect the light emitting cells in a series-parallel configuration; and an insulation layer formed on the surface of the light emitting cell to prevent an undesired connection between the connection parts and the light emitting cell.

Herein, M light emitting cells located in each column may be divided into a plurality of groups each having two or more light emitting cells connected in series to each other, and the light emitting cells of the groups may be formed such that the electrodes of the same polarity face each other in the light emitting cells of the adjacent groups.

The connection part may include: at least one first connection part connected to the first-conductivity-type semiconductor layer of the light emitting cell located at one end of each group; at least one second connection part connected to the second-conductivity-type semiconductor layer of the light emitting cell located at the other end of each group; and a series interconnection part formed to connect the light emitting cells of the groups in series to each other.

The present invention also provides a new scheme for connection between light emitting cells.

According to another aspect of the present invention, there is provided a semiconductor light emitting device including:

a substrate; a plurality of light emitting cells disposed on the top surface of the substrate, the light emitting cells each having a first-conductivity-type semiconductor layer, an active layer, and a second-conductivity-type semiconductor layer formed sequentially on the top surface of the substrate, wherein a region between the light emitting cells is defined as an isolation region removed to at least the active layer; a plurality of connection parts formed on the substrate with the light emitting cells formed thereon to connect the light emitting cells in a parallel or series-parallel configuration; and an insulation layer formed on the surface of the light emitting cell to prevent an undesired connection between the connection parts and the light emitting cell.

Herein, the connection part may include an intermediate connection part disposed between adjacent light emitting cells and formed in the array direction of the light emitting cells, and the adjacent light emitting cells may be connected through the intermediate connection part.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
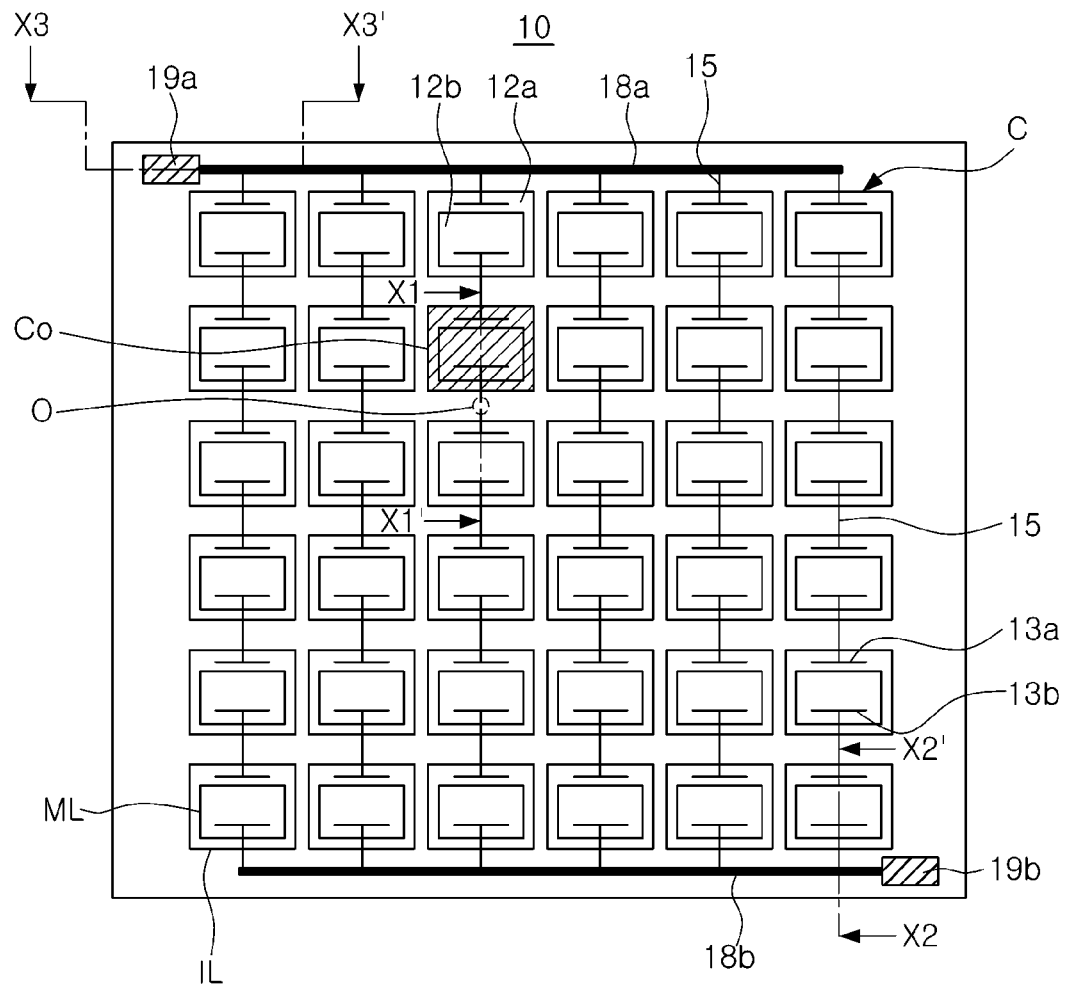
FIG. 1 is a top plan view illustrating a multi-cell array semiconductor light emitting device according to a first embodiment (a combination of series and parallel connections) of the present invention.

Exemplary embodiments of the present invention will now be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. Like reference numerals in the drawings denote like elements, and thus their description will be omitted.

Figure 2:
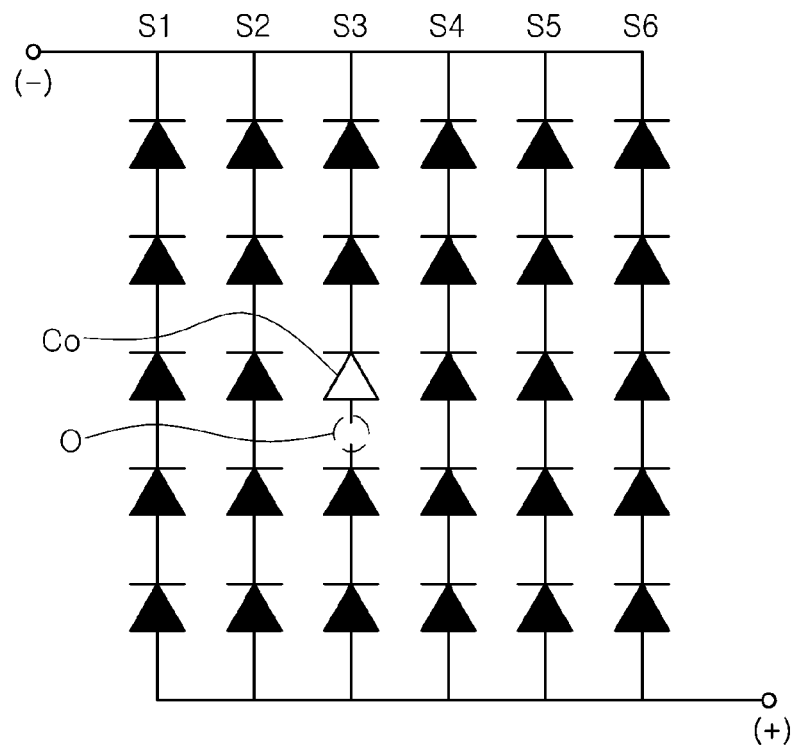
FIG. 2 is an equivalent circuit diagram of a multi-cell array implemented in the multi-cell array semiconductor light emitting device illustrated in FIG. 1.
Figure 3A:
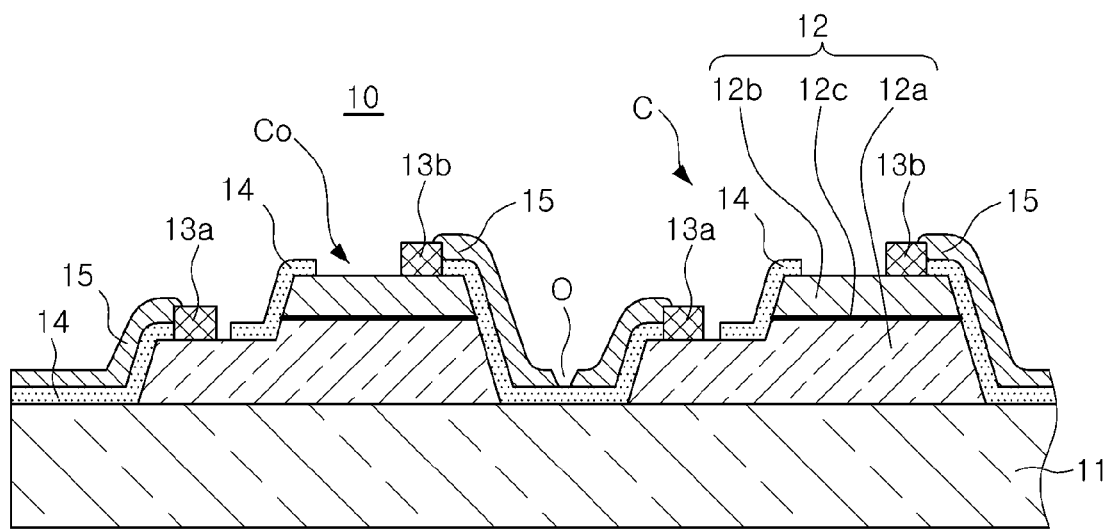
FIGS. 3A through 3C are partial side sectional views illustrating the connection between cells of the multi-cell array semiconductor light emitting device illustrated in FIG. 1.
Figure 3B:
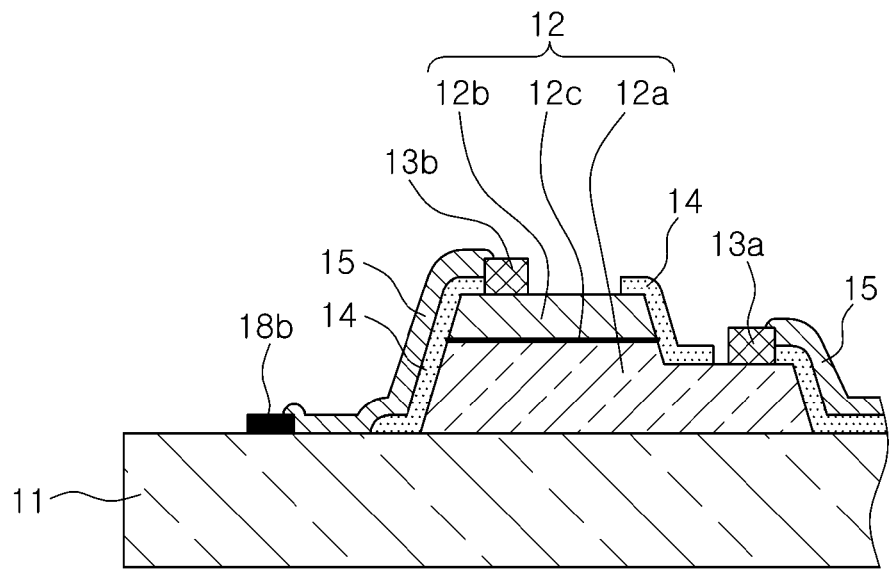
Figure 3C:
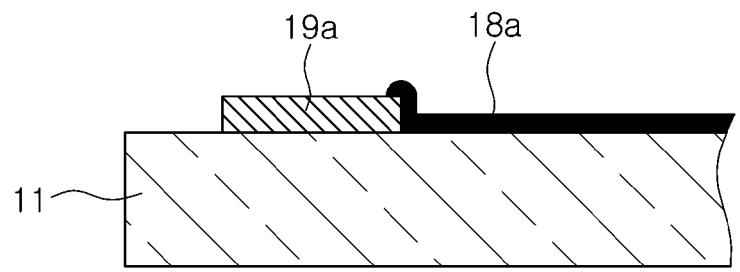

FIG. 1 is a top plan view illustrating a multi-cell array semiconductor light emitting device according to a first embodiment (a combination of series and parallel connections) of the present invention. FIG. 2 is an equivalent circuit diagram of a multi-cell array implemented in the multi-cell array semiconductor light emitting device illustrated in FIG. 1. FIGS. 3A through 3C are partial side sectional views illustrating the connection between cells of the multi-cell array semiconductor light emitting device illustrated in FIG. 1.

Referring to FIG. 1, a multi-cell array semiconductor light emitting device 10 according to this embodiment includes a substrate 11, and a plurality of light emitting cells C arrayed in a 6×6 pattern on the top surface of the substrate 11.

As illustrated in FIGS. 3A and 3B, the light emitting cells C may be obtained by dividing a semiconductor multilayer structure 12 having a first-conductivity-type semiconductor layer 12a, an active layer 12c, and a second-conductivity-type semiconductor layer 12b that are sequentially formed on the top surface of the substrate 11.

In this embodiment, a cell isolation process is performed to entirely remove the semiconductor multilayer structure 12 (a complete isolation process) to expose the surface of the substrate 11. Also, the first-conductivity-type semiconductor layer 12 may have a region exposed through a mesa etching process. In FIG. 1, a line obtained by a complete isolation process is denoted by 'IL', and a line obtained by a mesa etching process is denoted by 'ML'. This denotation will also be similarly used in the other drawings related to a cell array.

A first electrode 13a and a second electrode 13b connected respectively to the first-conductivity-type semiconductor layer 12a and the second-conductivity-type semiconductor layer 12b may be formed in each of the light emitting cells. FIG. 1 illustrates that the first electrode 13a and the second electrode 13b are formed in parallel at regular intervals to provide a uniform current distribution over each of the light emitting cells; however, the present invention is not limited thereto.

According to another embodiment, a connection part is extended to connect to the semiconductor layer of the corresponding conductivity type, thereby realizing a desired interconnection structure without forming a separate electrode.

As illustrated in FIG. 2, the semiconductor light emitting device according to this embodiment has a series-parallel connection structure in which six light emitting cells C are connected in series to each other in each of columns S1~S6, and the six columns S1~S6 are connected in parallel to each other.

In this connection structure, the number of light emitting cells connected in series to each other may be selected according to the voltage standards. That is, the number of light emitting cells connected in series to each other in each column is determined to satisfy desired voltage standards, and the number of columns connected in parallel to each other is controlled to provide a desired output. In this case, the columns may have the same number of light emitting cells.

In this embodiment, the connection part may include: at least one first connection part 18a connected to the first-conductivity-type semiconductor layer 12a of the light emitting cell located at one end of each of the columns S1~S6; and at least one second connection part 18b connected to the second-conductivity-type semiconductor layer 12b of the light emitting cell located at the other end of each of the columns S1~S6. That is, as illustrated in FIGS. 1 and 3C, the first connection part 18a and the second connection part 18b may be connected respectively to a first bonding pad 19a and a second bonding pad 19b.

Also, the connection part may include a plurality of interconnection parts 15 formed such that the light emitting cells C belonging to each of the columns S1~S6 are connected in series to each other between the first connection part 18a and the second connection part 18b. The interconnection part 15 may connect the adjacent light emitting cells C in series to each other in each column and also connect the light emitting cells, located at both ends of each of the columns S1~S6, to the first connection part 18a and the second connection part 18b.

Specifically, as illustrated in FIG. 3A, in the same column, the interconnection part 15 may be used to connect the second electrode 13b of one light emitting cell and the first electrode 13a of another light emitting cell. Also, as illustrated in the drawings, for easier connection of the light emitting cells in the same column, the light emitting cells in each column may be formed such that the electrodes of opposite polarities face each other.

Herein, an insulation layer 14 is formed on the surface of the light emitting cell in order to prevent an undesired connection between the light emitting cell and the connection part. However, the insulation layer 14 may be provided as a passivation layer that is formed on the entire side surface of the light emitting cell to protect the light emitting cell.

Also, as illustrated in FIG. 3B, the interconnection part 15 connected to the second electrode 13b of the light emitting cell located at the other end of the column S6 may be formed along the insulation layer 14 to be connected to the second connection part 18b. Likewise, the first electrode 13a of the light emitting cell located at one end of each column may be connected trough the interconnection part 15 to the first connection part 18a.

It is illustrated that the first connection part 18a and the second connection part 18b are connected respectively to the first electrode 13a and the second electrode 13b through the interconnection part 15. However, as described above, without forming a separate electrode in each light emitting cell, it may be directly connected to the semiconductor layer of a desired conductivity type through an interconnection line such as the interconnection part.

The first bonding pad 19a and the second bonding pad 19b may be formed of a different material than that of the first and second connection parts 18a and 18b and the interconnection part 15. For example, the first bonding pad 19a and the second bonding pad 19b may be formed of a metal layer such as Cr/Au, and the first and second connection parts 18a and 18b and the interconnection part 15 may be formed of a high-reflectivity, high-conductivity metal (OR: "metallic material") such as Al and Ag.

In other embodiments, the first and second bonding pads 19a and 19b, the first and second connection parts 18a and 18b, and the interconnection part 15 may be formed through a single metal pattern forming process. That is, the first and second bonding pads 19a and 19b, the first and second connection parts 18a and 18b, and the interconnection part 15 may be formed of the same metal. For example, the first and second bonding pads 19a and 19b, the first and second connection parts 18a and 18b, and the interconnection part 15 may be formed of may be formed of Cr/Au.

It may include at least one defective light emitting cell Co among the light emitting cells. In this embodiment, as illustrated in FIG. 1, the connection part related to a defective light emitting cell is disconnected and excluded from a connection circuit of another light emitting cell C, thereby preventing all the chips from being treated as defective chips. The disconnection of the connection part for the exclusion of the defective light emitting cell Co may be realized by removing a portion of the electrode line constituting the connection part (particularly, the interconnection part).

FIG. 3A is a side sectional view of the multi-cell array semiconductor light emitting device taken along a line X1-X1' of FIG. 1, which illustrates the disconnection state of a connection part for exclusion of a defective light emitting cell.

As illustrated in FIG. 3A, the interconnection part 15 connected to the defective light emitting cell Co has a disconnected open region O. The open region O may be formed through a laser scribing process or a physical/chemical etching process.

According to the treatment of the defective light emitting cell Co, not only a defective light emitting cell Co but also the light emitting cells belonging to the column S3 connected in series to the defective light emitting cell Co are excluded from driving in the entire connection circuit. That is, in this embodiment, when one light emitting cell is determined to be defective and the connection part related to the defective light emitting cell is disconnected, the other five columns can be driven normally and five light emitting cells connected in series to the defective light emitting cell are not driven (that is, a waste of five normal light emitting cells for one defective chip).

Meanwhile, in this embodiment, it is illustrated that the open region O is formed at the interconnection part 15 connected directly to the defective light emitting cell Co. However, if it is an interconnection part belonging to the column S6, the defective light emitting cell may be excluded from the total connection by disconnecting any interconnection part of a different location that is not directly connected to the defective light emitting cell.

In the above embodiment, a 6×6 light emitting cell array is exemplified as a series-parallel mode; however, the present invention is not limited thereto. That is, the present invention may be similarly applicable to an M×N light emitting cell array (herein, M and N are integers equal to or greater than 2). Also, the defective chip removing scheme may be similarly applicable to a case in which each column includes two or more light emitting cells connected in series to each other.

Unlike the series-parallel connection mode, the semiconductor light emitting device may be implemented such that all of the light emitting cells are connected in parallel to each other. This will be described below in detail with reference to FIGS. 4 through 6.

Figure 4:
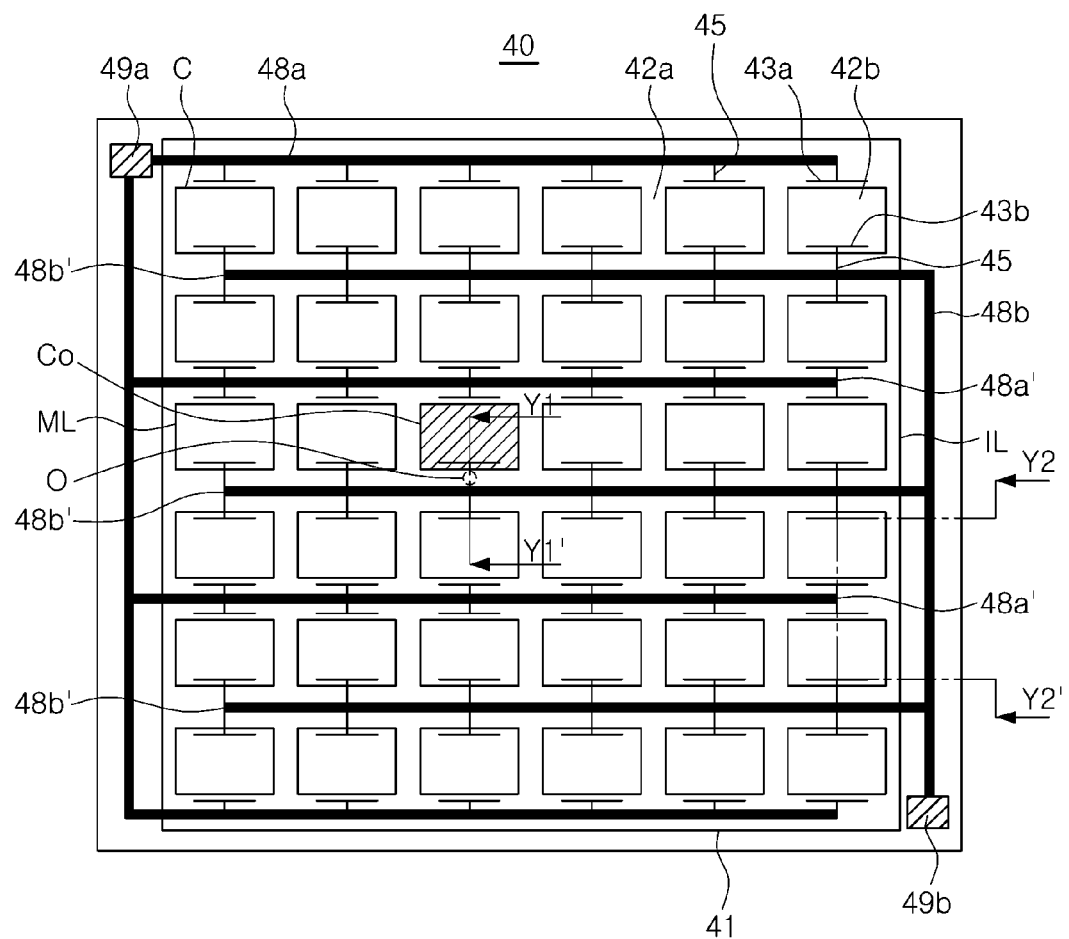
FIG. 4 is a top plan view illustrating a multi-cell array semiconductor light emitting device according to a second embodiment (a parallel connection) of the present invention.
Figure 5:
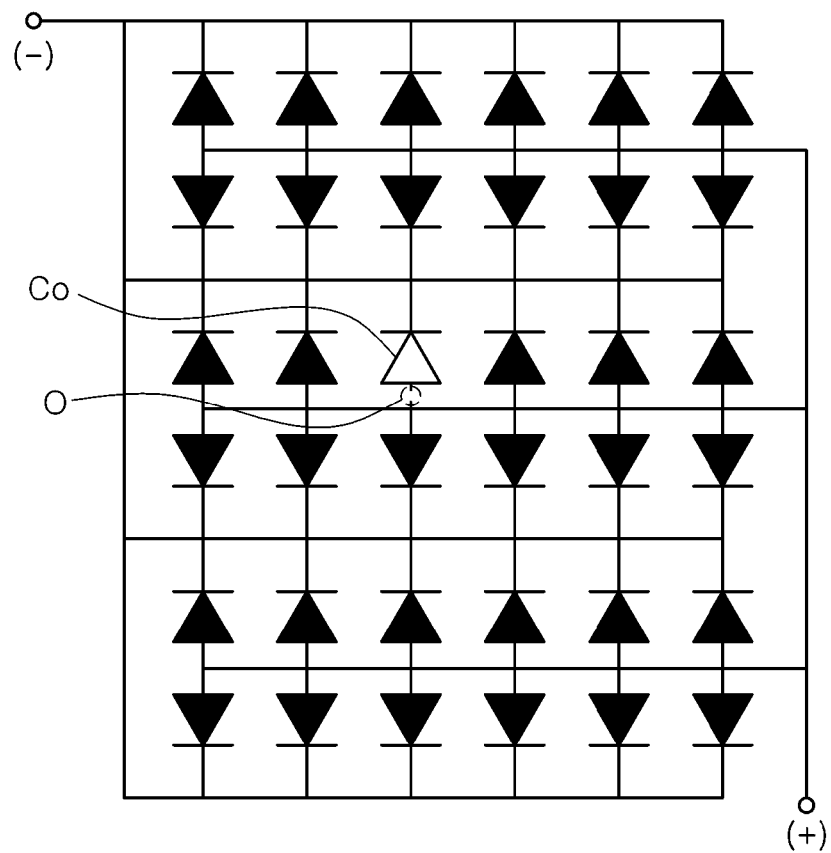
FIG. 5 is an equivalent circuit diagram of a multi-cell array implemented in the multi-cell array semiconductor light emitting device illustrated in FIG. 4.

FIG. 4 is a top plan view illustrating a multi-cell array semiconductor light emitting device according to a second embodiment (a parallel connection) of the present invention. FIG. 5 is an equivalent circuit diagram of a multi-cell array implemented in the multi-cell array semiconductor light emitting device illustrated in FIG. 4.

Figure 6A:
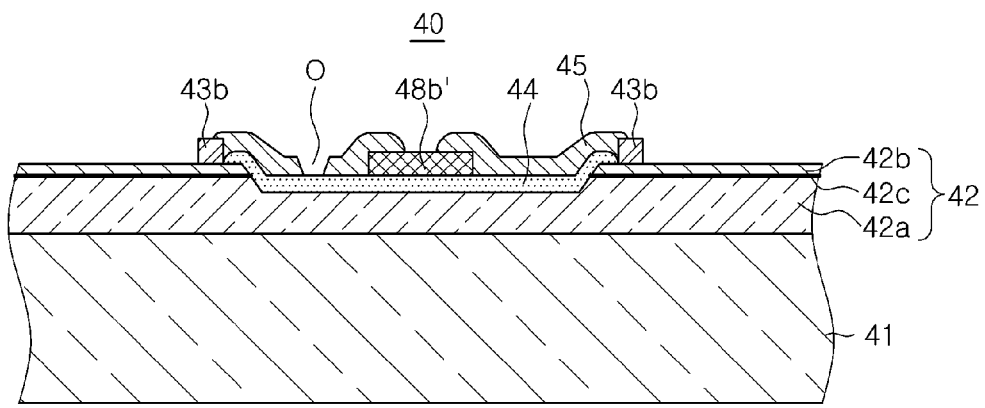
FIGS. 6A and 6B are partial side sectional views illustrating the connection between cells of the multi-cell array semiconductor light emitting device illustrated in FIG. 4.
Figure 6B:
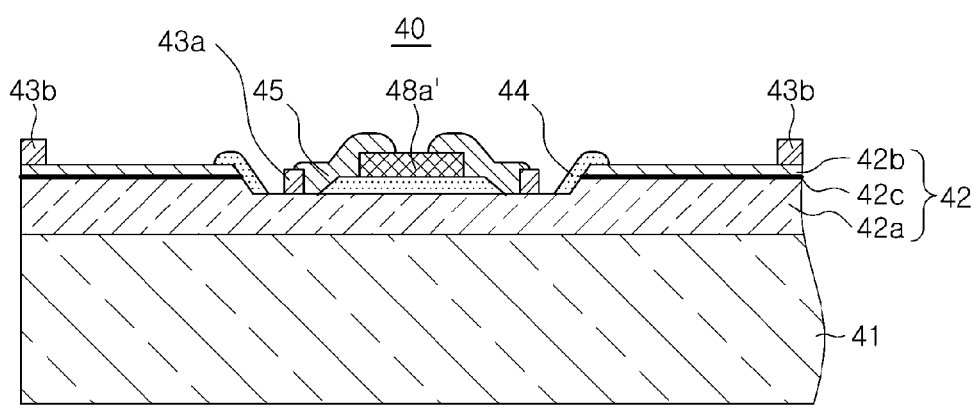

FIGS. 6A and 6B are partial side sectional views illustrating the connection between cells of the multi-cell array semiconductor light emitting device illustrated in FIG. 4.

Referring to FIG. 6, a multi-cell array semiconductor light emitting device 40 according to this embodiment includes a substrate 41, and a plurality of light emitting cells C arrayed in a 6×6 pattern on the top surface of the substrate 41.

As illustrated in FIGS. 6A and 6B, the light emitting cells C may be obtained by dividing a semiconductor multilayer structure 42 having a first-conductivity-type semiconductor layer 42a, an active layer 42c, and a second-conductivity-type semiconductor layer 42b that are sequentially formed on the top surface of the substrate 41. The isolation process used in this embodiment is illustrated as being performed through a partial isolation process (a mesa etching process) that exposes the first-conductivity-type semiconductor layer of the semiconductor multilayer structure 42.

Also, an insulation layer 44 is formed on the surface of the light emitting cell in order to prevent the connection part (for parallel connection of the light emitting cells) from being connected to an undesired portion of the light emitting cell.

In this embodiment, a first electrode 43a and a second electrode 43b connected respectively to the first-conductivity-type semiconductor layer 42a and the second-conductivity-type semiconductor layer 42b may be formed in each of the light emitting cells C. However, as described above, the connection part is extended to connect to the semiconductor layer of the corresponding conductivity type, thereby realizing a desired interconnection structure without forming a separate electrode.

As illustrated in FIG. 5, the semiconductor light emitting device 40 according to this embodiment has a parallel connection structure in which light emitting cells are connected in parallel to each other.

For the parallel connection of light emitting cells, the connection part may include: at least one first connection part 48a/48a' connected to the first-conductivity-type semiconductor layer 42a of the light emitting cells; and at least one second connection part 48b/48b' connected to the second-conductivity-type semiconductor layer 42b of the light emitting cells.

Also, the connection part may include: a plurality of first interconnection parts 45a connecting the first connection part 48a/48a' and the first-conductivity-type semiconductor layer 42a; and a plurality of second interconnection parts 45b connecting the second connection part 48b/48b' and the second-conductivity-type semiconductor layer 42b.

In this embodiment, the first connection part 48a/48a' and the second connection part 48b/48b' may be formed in an exposed region of the first-conductivity-type semiconductor layer 42a or the substrate 41. As illustrated in FIGS. 6A and 6B, the first connection part 48a/48a' and the second connection part 48b/48b' may be formed on the insulation layer 44 without being directly connected to the second-conductivity-type semiconductor layer.

Also, as illustrated in FIG. 4, the first connection part 48a and the second connection part 48b may be connected respectively to a first bonding pad 49a and a second bonding pad 49b.

Specifically, for the realization of an easy parallel connection structure in the 6×6 light emitting cell array, the light emitting cells C may be formed such that the electrodes of the same polarity in each column face each other, as illustrated in FIG. 4.

In the above array of the light emitting cells C in which the electrodes of the same polarity face each other, as illustrated in FIG. 1, the first connection part 48a/48a' and the second connection part 48b/48b' may include at least one first intermediate connection part 48a' and at least one second intermediate connection part 48b' that are formed between the adjacent rows and are connected to the semiconductor layer of the same polarity of the light emitting cell located at both sides.

Herein, the first intermediate connection part 48a' and the second intermediate connection part 48b' may be connected to the semiconductor layer of the same polarity (the first electrode and the second electrode in this embodiment).

As illustrated in FIG. 6A, the second intermediate connection part 48b' may be formed on the insulation layer 44, and may be connected to the second interconnection part 45b connected to the second electrode 43b of two light emitting cells located at both sides.

The insulation layer 44 may be formed on the side surface of the light emitting cell and the exposed top surface of the first-conductivity-type semiconductor layer 42a in order to prevent an undesired connection between the second interconnection part 45b (connected to the second intermediate connection part 48b') and the light emitting cell.

As illustrated in FIG. 6B, the first intermediate connection part 48a' may be formed on the insulation layer 44, and the first electrode 43a of the two light emitting cells may be formed on both sides of the first intermediate connection part 48a' on the exposed top surface of the first-conductivity-type semiconductor layer 42a. The first intermediate connection part 48a' and the first electrode 43a may be connected to each other by the first interconnection part 45a.

For implementation of a parallel connection in the 6×6 array, the semiconductor light emitting device 40 according to this embodiment has four first connection parts 48a/48a' and three second connection parts 48b' that are formed in a row direction. Three of the four first connection parts is used as the first intermediate connection part 48a' and all of the three second connection parts are used as the second intermediate connection part 48b', so that it may be connected through the interconnection part 45 to the corresponding electrodes of the light emitting cells arrayed in the adjacent rows.

In this embodiment, it may include at least one defective light emitting cell Co among the light emitting cells. As illustrated in FIGS. 4 and 5, the connection part (specifically, the interconnection part) related to the defective light emitting cell may be disconnected and excluded from a connection circuit of another light emitting cell C.

As illustrated in FIG. 6A, an open region O is formed to disconnect the second interconnection part 45b connecting a defective light emitting cell Co and the second intermediate connection part 48b', thereby excluding the defective light emitting cell Co from a connection circuit of another light emitting cell C.

In this embodiment, because all of the light emitting cells are connected in parallel to each other, even when the interconnection part related to the defective light emitting cells is disconnected, all of the other light emitting cells except the defective light emitting cells can be driven. That is, even when one defective light emitting cell Co is excluded, 35 light emitting cells can be normally driven in the parallel connection structure according to this embodiment.

When compared to the light quantity reduction of the connection structure illustrated in FIG. 1 (e.g., additional exclusion of five normal light emitting cells in the event of one defective light emitting cell), the semiconductor light emitting device 40 according to this embodiment can reduce the light quantity reduction according to the treatment of the same number of defective light emitting cells.

For the connection of light emitting cells, the use of a series-parallel connection structure having a partial series connection according to the light quantity and a desired voltage may be inevitable. In the semiconductor light emitting device having light emitting cells of a series-parallel connection structure, it may be necessary to minimize the light quantity reduction by reducing the number of normal light emitting cells wasted due to the treatment of a defective light emitting cell.

Figure 7:
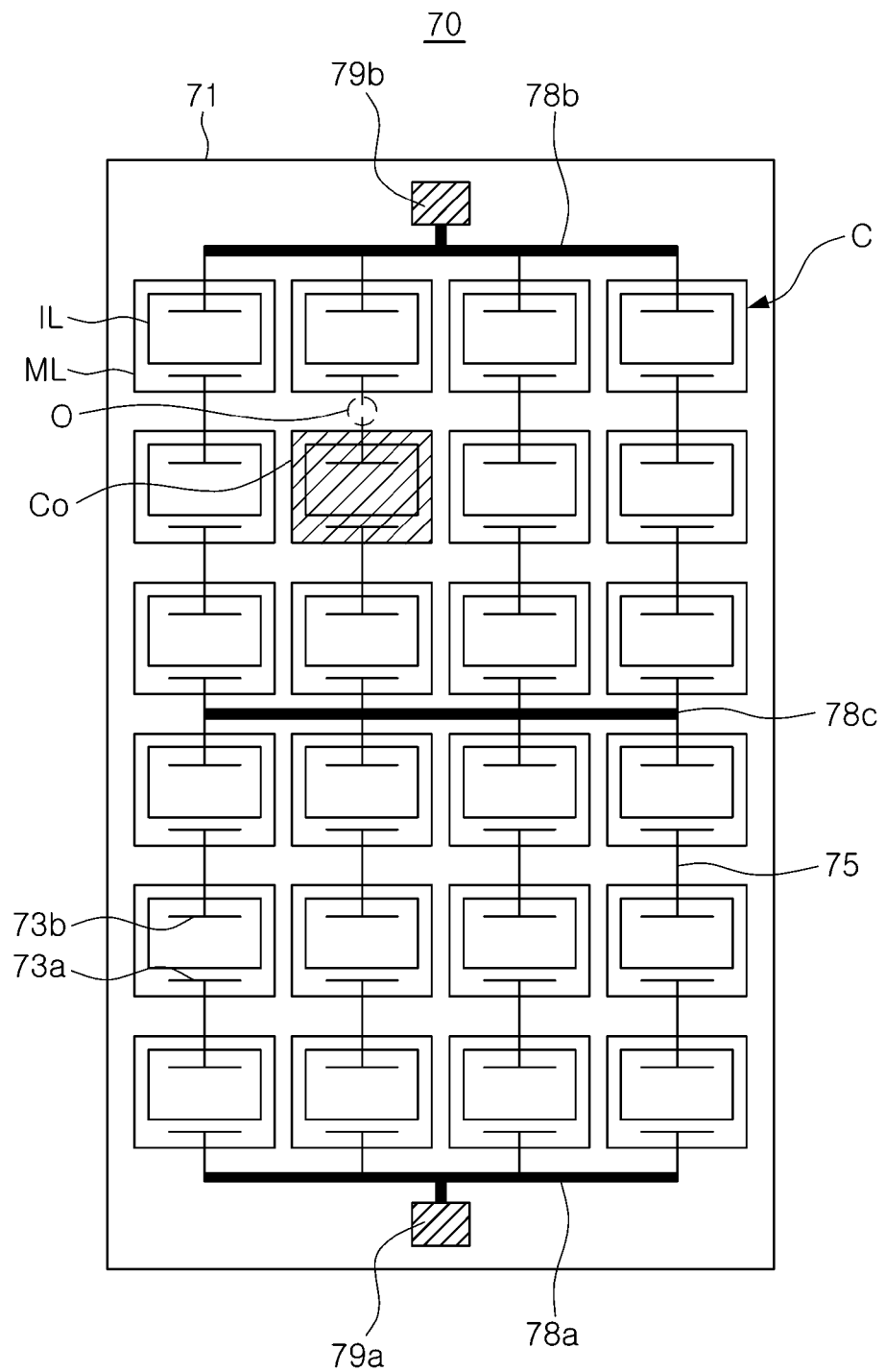
FIG. 7 is a top plan view illustrating a multi-cell array semiconductor light emitting device according to an improvement of the first embodiment of the present invention.
Figure 8:
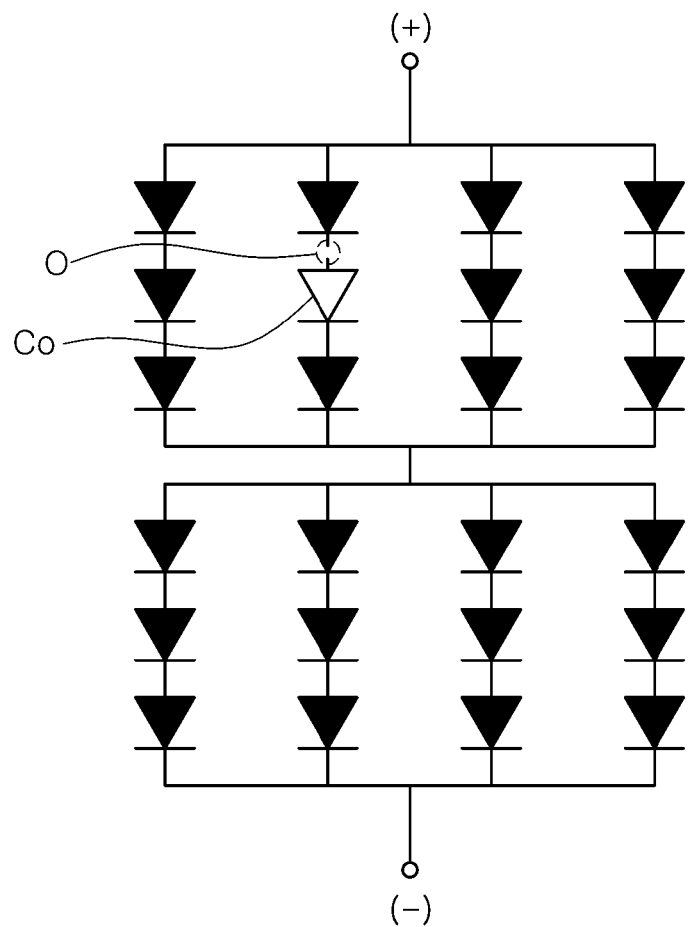
FIG. 8 is an equivalent circuit diagram of a multi-cell array implemented in the multi-cell array semiconductor light emitting device illustrated in FIG. 7.
Figure 9:
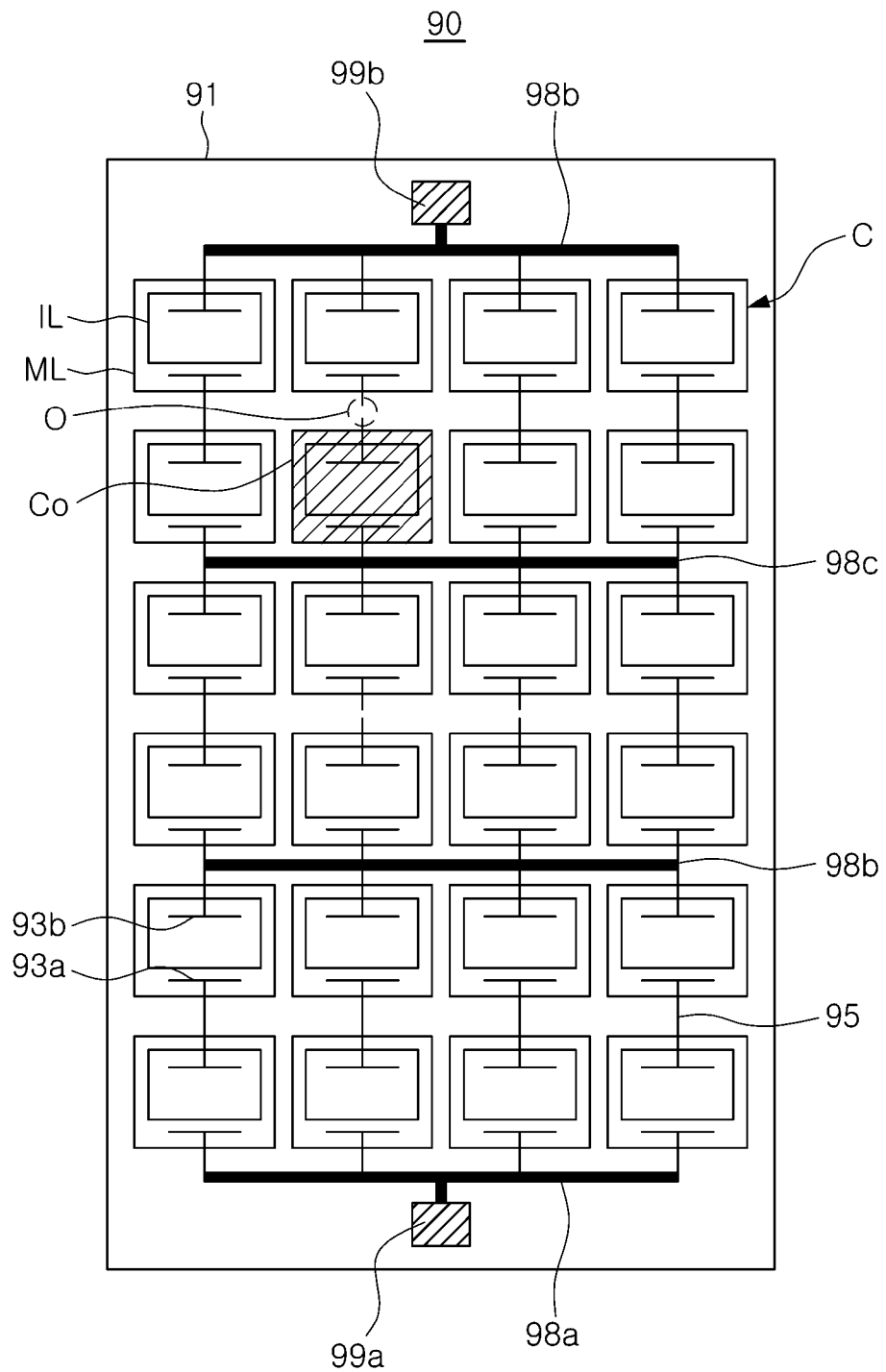
FIG. 9 is a top plan view illustrating a multi-cell array semiconductor light emitting device according to another improvement of the first embodiment of the present invention.
Figure 10:
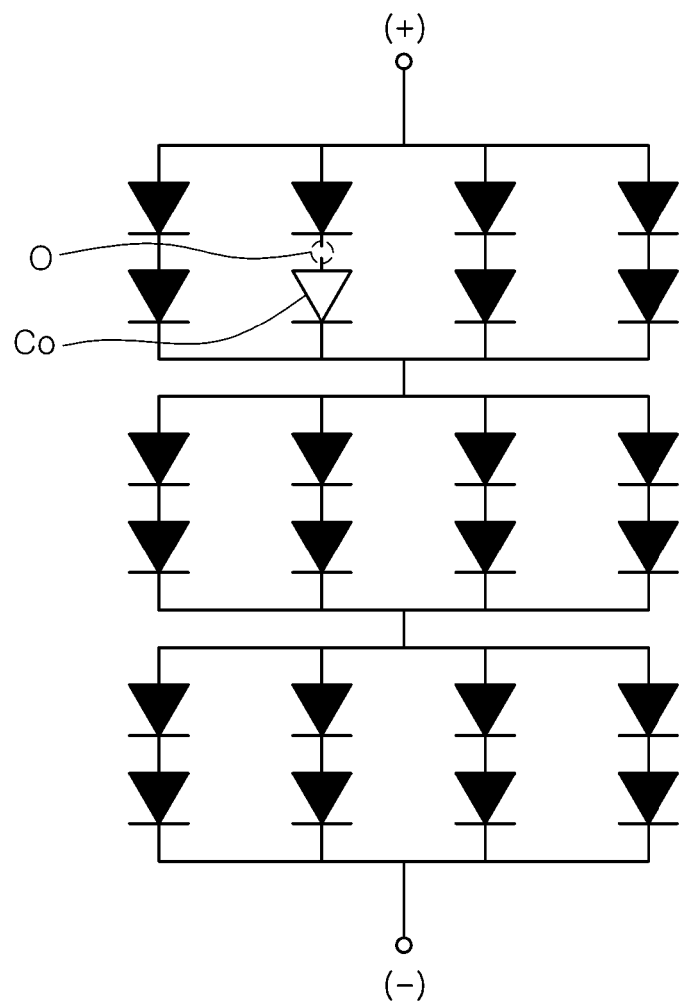
FIG. 10 is an equivalent circuit diagram of a multi-cell array implemented in the multi-cell array semiconductor light emitting device illustrated in FIG. 9.

FIG. 7 is a top plan view illustrating a multi-cell array semiconductor light emitting device according to an improvement of the first embodiment of the present invention. FIG. 8 is an equivalent circuit diagram of a multi-cell array implemented in the multi-cell array semiconductor light emitting device illustrated in FIG. 7. FIG. 9 is a top plan view illustrating a multi-cell array semiconductor light emitting device according to another improvement of the first embodiment of the present invention. FIG. 10 is an equivalent circuit diagram of a multi-cell array implemented in the multi-cell array semiconductor light emitting device illustrated in FIG. 9.

FIGS. 7 through 11 illustrate various embodiments using an intermediate connection part, as a scheme for satisfying the above requirements in the series-parallel connection structure like the first embodiment.

Referring to FIG. 7, a multi-cell array semiconductor light emitting device 70 according to this embodiment includes a substrate 71, and a plurality of light emitting cells C arrayed in a 6×4 pattern on the top surface of the substrate 71. Like the aforesaid embodiment, the light emitting cells C may be obtained by dividing a semiconductor multilayer structure having a first-conductivity-type semiconductor layer, an active layer, and a second-conductivity-type semiconductor layer that are sequentially formed on the top surface of the substrate 71.

In this embodiment, an isolation process is performed to entirely remove the semiconductor multilayer structure (a complete isolation process) to expose the surface of the substrate 71. Also, the first-conductivity-type semiconductor layer may have a region exposed through a mesa etching process. A first electrode 73a and a second electrode 73b connected respectively to the first-conductivity-type semiconductor layer 72a and the second-conductivity-type semiconductor layer 72b may be formed in each of the light emitting cells.

Like the embodiment illustrated in FIG. 1, the semiconductor light emitting device according to this embodiment has a series-parallel connection structure in which six light emitting cells C are connected in series to each other in four columns, and the four columns are connected in parallel to each other.

For this connection structure, the connection part may include: a first connection part 78a connected to the first electrode 73a of the light emitting cell located at one end of each of the columns; and a second connection part 78b connected to the second electrode 73b of the light emitting cell located at the other end of each of the columns. As illustrated in FIG. 7, the first connection part 78a and the second connection part 78b may be connected respectively to a first bonding pad 79a and a second bonding pad 79b.

Also, an interconnection part 75 may be formed to connect the light emitting cells C of the columns in series to each other between the first connection part 78a and the second connection part 78b. For easy realization of the series connection by the interconnection part 75, the light emitting cells C may be arranged such that the opposite polarities thereof face each other in each column.

The connection part may include at least one intermediate connection part 78c that is formed to connect the interconnection part 75 of a portion of the columns in the row direction.

It is illustrated that the intermediate connection part 78c is formed in the row direction between the third light emitting cell row and the fourth light emitting cell row. Also, as illustrated in FIG. 7, the intermediate connection part 78c may be connected to all of four interconnection parts 75 related to each column.

By the intermediate connection part, as illustrated in FIG. 8, a series-parallel connection circuit may have a common contact point between the third light emitting cell row and the fourth light emitting cell row. That is, two 3×4 series-parallel circuits are connected in series to each other.

In this embodiment, when one defective light emitting cell Co is generated, an open region O may be formed at the interconnection part related thereto for disconnection from another circuit. At this point, two light emitting cells connected in series to the defective light emitting cell, that is, other two light emitting cells belonging to the second column of the 3×4 series-parallel circuit that is the first stage belonging to the defective light emitting cell are not driven. However, all of the light emitting cells belonging to the 3×4 series-parallel circuit that is the next stage and other column of the same stage can be driven by the intermediate connection unit 78c.

In a circuit illustrated in FIG. 8, when the connection part related to one defective light emitting cell Co is disconnected, two normal light emitting cells are also excluded from the circuit and the light quantity corresponding to 21 light emitting cells among a total of 24 light emitting cells can be maintained.

All of the same columns are excluded in the series-parallel connection structure illustrated in FIG. 1 (an additional exclusion of five normal light emitting cells in the event of one defective light emitting cell). However, in this embodiment, because only a portion of the cells in the same column are excluded when treating a defective light emitting cell, the number of normal light emitting cells excluded from the circuit can be reduced (additional exclusion of only two normal light emitting cells in the event of one defective light emitting cell).

Also, even when the defective light emitting cell is removed, because a current can be uniformly distributed to the columns through the parallel circuit, the intermediate connection part of this embodiment can reduce a concentration of light emission on a specific region.

In the series-parallel connection circuit, the aforesaid intermediate connection part may have various modified configurations according to various embodiments.

Referring to FIG. 9, a multi-cell array semiconductor light emitting device 90 according to this embodiment includes a substrate 91, and a plurality of light emitting cells C arrayed in a 6×4 pattern on the top surface of the substrate 91. A first electrode 93a and a second electrode 93b connected respectively to the first-conductivity-type semiconductor layer and the second-conductivity-type semiconductor layer may be formed in each of the light emitting cells.

Like the cell array illustrated in FIG. 7, the semiconductor light emitting device 90 according to this embodiment has a series-parallel connection structure in which six light emitting cells C are connected in series to each other in four columns, and the four columns are connected in parallel to each other.

That is, the connection part of this embodiment may include: a first connection part 98a connected to the first electrode 93a of the light emitting cell located at one end of each of the columns; a second connection part 98b connected to the second electrode 93b of the light emitting cell located at the other end of each of the columns; and an interconnection part 95 connecting the light emitting cells belonging to each of the light emitting cells in series to each other between the first connection part 98a and the second connection part 98b.

As illustrated in FIG. 9, the first connection part 98a and the second connection part 98b may be respectively connected to a first bonding pad 99a and a second bonding pad 99b.

Unlike the embodiment illustrated in FIG. 7, this embodiment uses a plurality (e.g., two) of intermediate connection parts 98c and 98d formed at the locations corresponding to different row directions. It is illustrated that the intermediate connection parts 98c and 98d of this embodiment are formed between the second light emitting cell row and the third light emitting cell row and between the fourth light emitting cell row and the sixth light emitting cell row. The intermediate connection parts 98c and 98d are connected to four interconnection parts 95 related to all of the columns.

There is no limitation on the number of light emitting cells located in each stage divided by the intermediate connection parts 98c and 98d, and the number of light emitting cells located in each stage divided by the intermediate connection part in each column may vary according embodiment.

In this embodiment, when one defective light emitting cell Co is generated, an open region O may be formed at the interconnection part 95 related thereto for disconnection from another circuit. At this point, another light emitting cell connected in series to the defective light emitting cell, that is, another light emitting cell belonging to the second column of the 2×4 series-parallel circuit that is the first stage belonging to the defective light emitting cell is not driven. However, the 2×4 series-parallel circuit that is the other two stages and the other column of the same stage can be driven by the intermediate connection units 98c and 98d.

Specifically, in a circuit illustrated in FIG. 10, when the connection part related to one defective light emitting cell Co is disconnected, one normal light emitting cell is also excluded from the circuit and the light quantity corresponding to 22 light emitting cells among a total of 24 light emitting cells can be maintained. Compared to the embodiment illustrated in FIGS. 7 and 8, this embodiment can secure the light quantity corresponding to one or more normal light emitting cells when treating one defective light emitting cell of the same location.

In this manner, a plurality of intermediate connection parts are used to further reduce the number of light emitting cells located between the intermediate connection parts in each column, thereby greatly reducing the number of normal light emitting cells wasted due to the treatment of a defective light emitting cell.

Also, even when a defective light emitting cell is removed, because it is again connected in parallel at each node, a more uniform current distribution can be secured, thus reducing a concentration of light emission on a specific region.

Figure 11:
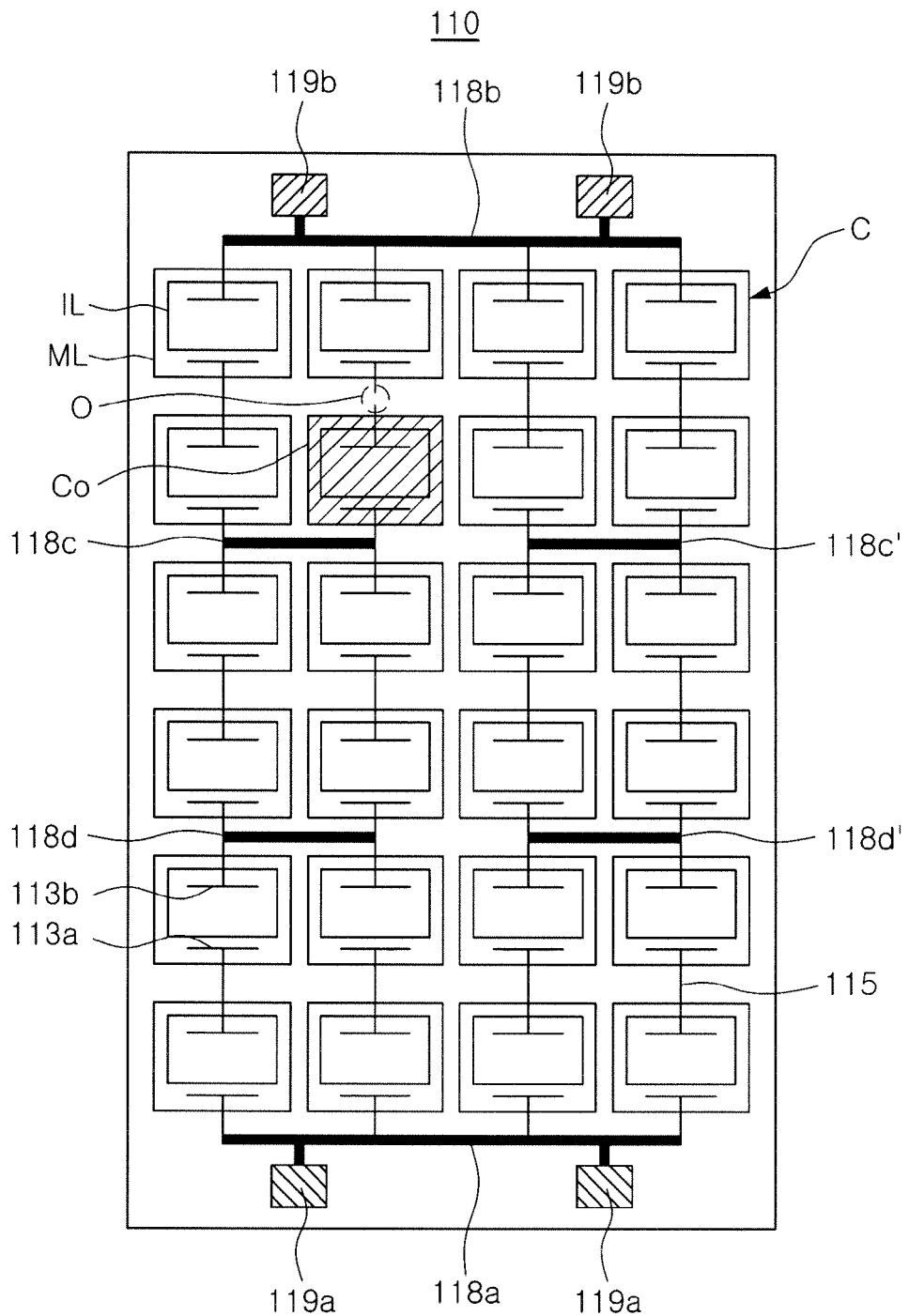
FIG. 11 is a top plan view illustrating a multi-cell array semiconductor light emitting device according to another improvement of the first embodiment of the present invention.
Figure 12:
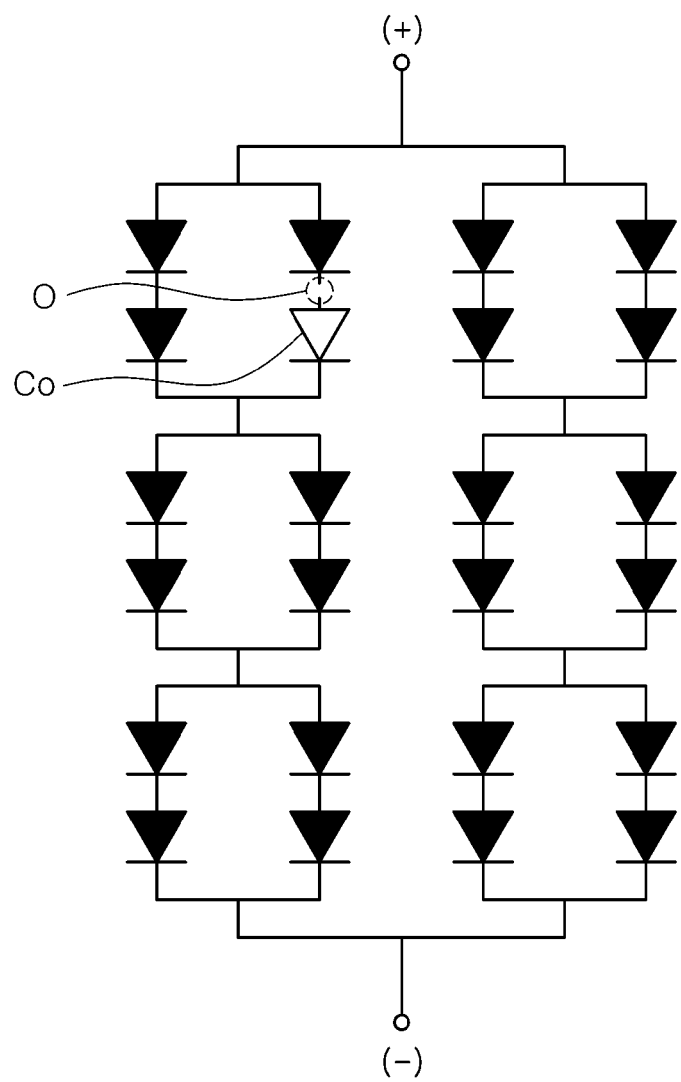
FIG. 12 is an equivalent circuit diagram of a multi-cell array implemented in the multi-cell array semiconductor light emitting device illustrated in FIG. 11.

FIG. 11 is a top plan view illustrating a multi-cell array semiconductor light emitting device according to another improvement of the first embodiment of the present invention. FIG. 12 is an equivalent circuit diagram of a multi-cell array implemented in the multi-cell array semiconductor light emitting device illustrated in FIG. 11.

Referring to FIG. 11, a multi-cell array semiconductor light emitting device 110 according to this embodiment includes a substrate 111, and a plurality of light emitting cells C arrayed in a 6×4 pattern on the top surface of the substrate 111. A first electrode 113a and a second electrode 113b connected respectively to the first-conductivity-type semiconductor layer and the second-conductivity-type semiconductor layer may be formed in each of the light emitting cells.

Like the cell array illustrated in FIG. 7, the semiconductor light emitting device 110 according to this embodiment has a 6×4 series-parallel connection structure.

The connection part of this embodiment may include: a first connection part 118a connected to the first electrode 113a of the light emitting cell located at one end of each of the columns; a second connection part 118b connected to the second electrode 113b of the light emitting cell located at the other end of each of the columns; and an interconnection part 115 connecting the light emitting cells belonging to each of the light emitting cells in series to each other between the first connection part 118a and the second connection part 118b.

As illustrated in FIG. 11, the first connection part 118a and the second connection part 118b may be connected respectively to two first bonding pads 119a and two second bonding pads 119b disposed directly on the substrate. Because the two bonding pads 119a and 119b may be disposed about the same distance from two adjacent light emitting cells (the line length of the connection part), they can distribute a current to the columns of each light emitting cell more uniformly.

Like the embodiment illustrated in FIG. 8, this embodiment uses a plurality of intermediate connection parts 118c, 118c', 118d and 118d' formed at the locations corresponding to different row directions. However, it is illustrated that intermediate connection parts 118c, 118c', 118d and 118d' are connected only to the interconnection part 115 related to two columns in the row direction.

In this embodiment, when one defective light emitting cell Co is generated, an open region O may be formed at the interconnection part 115 related thereto for disconnection from another circuit.

Like FIG. 9, in this embodiment, another light emitting cell connected in series to the defective light emitting cell, that is, another light emitting cell belonging to the second column of the 2×4 series-parallel circuit that is the first stage belonging to the defective light emitting cell is not driven. However, the 2×4 series-parallel circuit that is other two stages and other column of the same stage can be driven by the intermediate connection parts 118c, 118c', 118d and 118d'.

Thus, when compared to the embodiment illustrated in FIG. 7, this embodiment secures more drivable light emitting cells when removing a defective light emitting cell.

Figure 13:
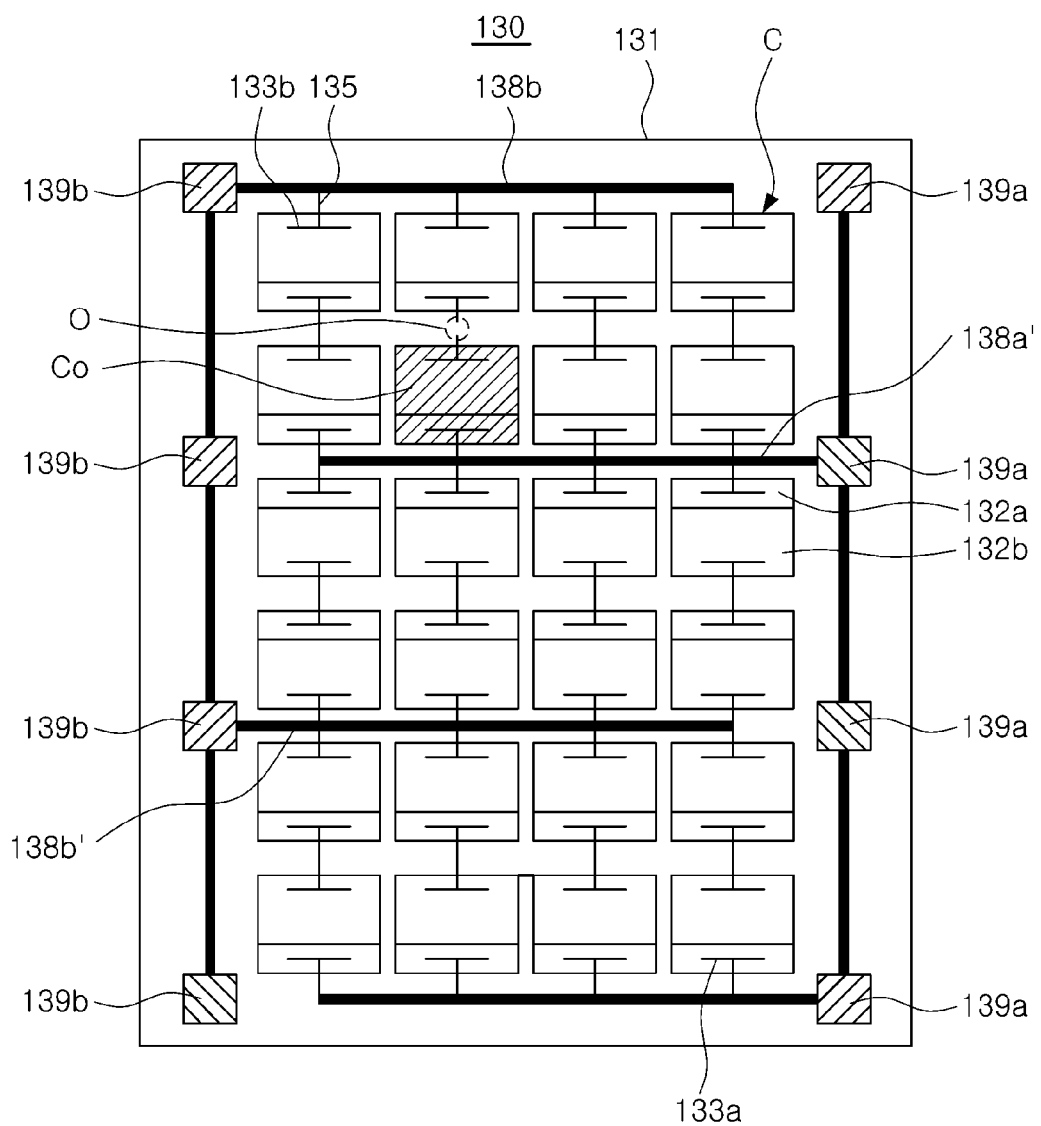
FIG. 13 is a top plan view illustrating a multi-cell array semiconductor light emitting device according to a third embodiment of the present invention.
Figure 14:
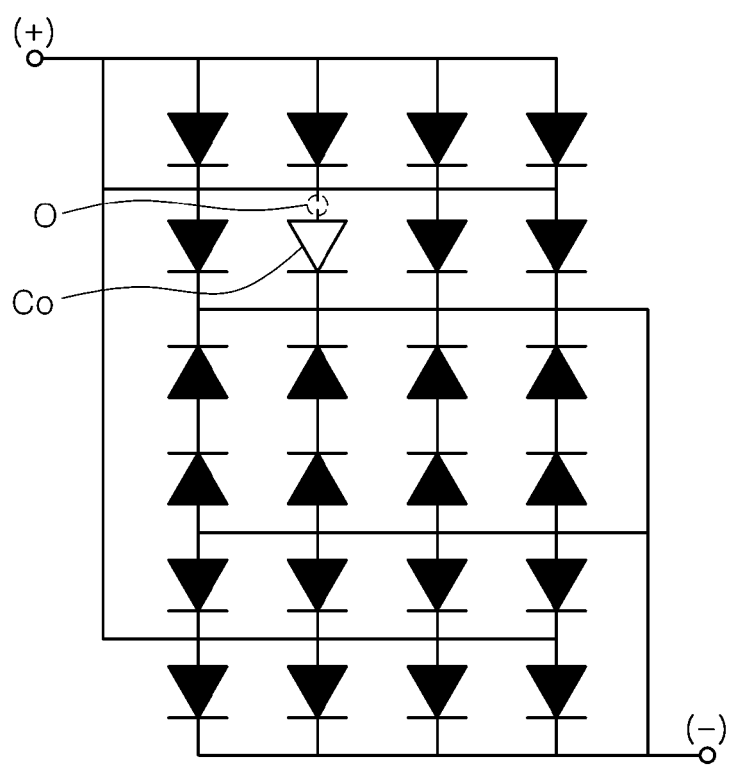
FIG. 14 is an equivalent circuit diagram of a multi-cell array implemented in the multi-cell array semiconductor light emitting device illustrated in FIG. 13.

FIG. 13 is a top plan view illustrating a multi-cell array semiconductor light emitting device according to a third embodiment of the present invention. FIG. 14 is an equivalent circuit diagram of a multi-cell array implemented in the multi-cell array semiconductor light emitting device illustrated in FIG. 13.

Referring to FIG. 13, a multi-cell array semiconductor light emitting device 130 according to this embodiment includes a substrate 131, and a plurality of light emitting cells C arrayed in a 6×4 pattern on the top surface of the substrate 131.

Like the aforesaid embodiment, the light emitting cells C may be obtained by dividing a semiconductor multilayer structure having a first-conductivity-type semiconductor layer, an active layer, and a second-conductivity-type semiconductor layer that are sequentially formed on the top surface of the substrate 131.

In this embodiment, a complete isolation process is performed to isolate the semiconductor multilayer structure by light emitting cell to expose the surface of the substrate 131. Also, the first-conductivity-type semiconductor layer may have a region exposed through a mesa etching process.

As illustrated in FIG. 13, the mesa-etched region of each light emitting cell is limited to one side where the first electrode 133a is formed. In this embodiment, a mesa etching process is prevented from being performed also on a region adjacent to another side, thereby securing a wider active layer area capable of participating in light emission. This may be implemented by providing the same mask pattern for an isolation process and a mesa etching process in another side.

In this embodiment, a first electrode 133a and a second electrode 133b connected respectively to the first-conductivity-type semiconductor layer 132a and the second-conductivity-type semiconductor layer 132b may be formed in each light emitting cell C.

Also, an insulation layer (not illustrated) may be formed on the surface of the light emitting cell in order to prevent an undesired connection between the connection part and the light emitting cell.

Six light emitting cells located in each column may be divided into a plurality of groups each having two light emitting cells connected in series to each other. For the easy realization of a parallel connection structure by the two series light emitting cells in the 6×4 light emitting cell array, the light emitting cells C of the adjacent groups may be formed such that the electrodes of the same polarity in each column face each other, as illustrated in FIG. 13.

The connection part of this embodiment may include: first connection parts 138a and 138a' connected to the first-conductivity-type semiconductor layer located at one end of each of the groups; second connection parts 138b and 138b' connected to the second-conductivity-type semiconductor layer located at the other end of each of the groups; and a series interconnection part 135 connecting the light emitting cells of the groups in series to each other.

The first connection parts 138a and 138a' and the second connection parts 138b and 138b' may be connected respectively to four first bonding pads 139a and four second bonding pads 139b. In this embodiment, the four first bonding pads 139a and the four second bonding pads 139b may be formed at regular intervals in order to provide a uniform current distribution.

In the above array of the light emitting cells C in which the electrodes of the same polarity face each other, as illustrated in FIG. 13, the first connection part and the second connection part may include a first intermediate connection part 138a' and a second intermediate connection part 138b' that are formed between the adjacent rows and are connected to the semiconductor layer of the same polarity of the light emitting cell located at both sides.

Herein, the first intermediate connection part 138a' and the second intermediate connection part 138b' may be connected to the semiconductor layer of the same polarity (the first electrode and the second electrode in this embodiment).

For the implementation of a series-parallel connection in the 6×4 array, the semiconductor light emitting device 130 according to this embodiment has two first connection parts 138a and 138a' and two second connection parts 138b and 138b' that are formed in the row direction. One of the two first connection parts is used as the first intermediate connection part 138a' and one of the two second connection parts is used as the second intermediate connection part 138b', so that it may be connected through the interconnection part 135 to the corresponding electrodes of the light emitting cells arrayed in the adjacent rows.

The connection structure may vary according to the cell array, the number of lines of the first and second connection parts (specifically, the intermediate connection part) may be one or plural according to the cell array.

In this embodiment, it may include at least one defective light emitting cell Co among the light emitting cells. The connection part related to a defective light emitting cell may be disconnected and excluded from a connection circuit of another light emitting cell C (particularly, the interconnection part).

Because the groups including two light emitting cells are connected in parallel to each other, even when the interconnection part related to the defective light emitting cells is disconnected, all of the other light emitting cells except the defective light emitting cells and the light emitting cells connected in series in the same group can be driven.

For example, when one defective light emitting cell Co is excluded from a light emitting cell connection circuit, 22 light emitting cells can be normally driven.

When compared to the light quantity reduction of the connection structure illustrated in FIGS. 1 and 7 (e.g., an additional exclusion of five normal light emitting cells (in the embodiment of FIG. 1) or five normal light emitting cells (in the embodiment of FIG. 7) in the event of one defective light emitting cell), the semiconductor light emitting device 130 according to this embodiment can reduce the light quantity reduction according to the treatment of the same number of defective light emitting cells (e.g., an additional exclusion of one normal light emitting cell in the event of one defective light emitting cell).

In the aforesaid embodiments, various arrays and interconnection structures of light emitting cells on the same substrate have been described. In particular, the intermediate connection parts described with reference to FIGS. 4, 7, 9, 11 and 13 provide further advantages of the present invention. The intermediate connection part means a pattern that is located between adjacent light emitting cells and is formed according to the array direction of the light emitting cells.

As described in the above embodiment, the semiconductor layers (or electrodes) of adjacent cells are not directly connected but are connected indirectly through the intermediate connection part, thereby easily implementing various interconnection structures described in the aforesaid embodiments.

The intermediate connection part is continuously formed not only between a pair of adjacent light emitting cells but also between pairs of light emitting cells in the row direction, thus assisting in implementing a complex circuit connection.

Figure 15A:
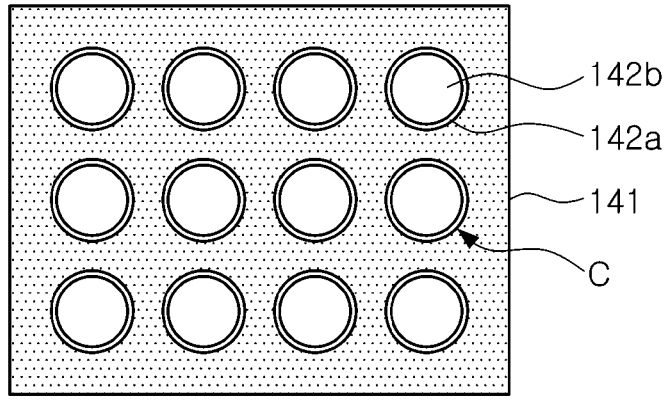
FIGS. 15A through 15C are plan views illustrating the states of multi-cell arrays according to various designs of light emitting cells.
Figure 15B:
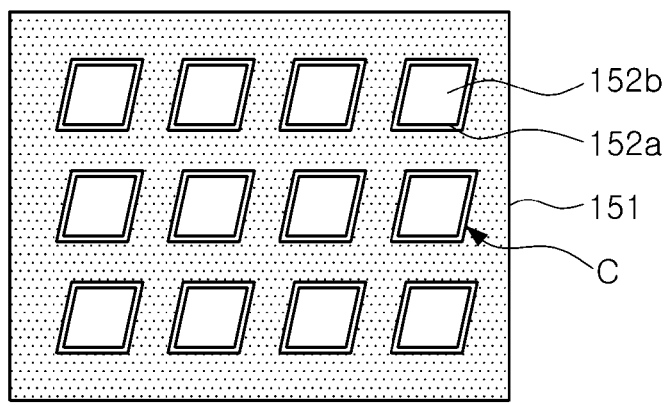
Figure 15C:
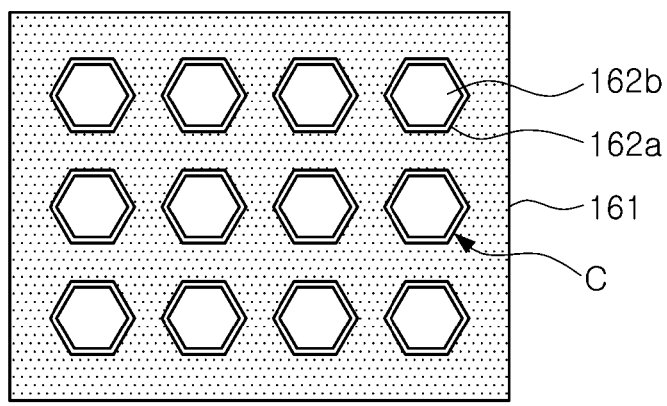

The light emitting cells usable in the semiconductor light emitting device of the present invention may have various configurations. FIGS. 15A through 15C are plan views illustrating the states of multi-cell arrays according to various designs of light emitting cells.

As illustrated in FIG. 15A, light emitting cells C with a circular section are arrayed on a substrate 141. The circular light emitting cell C has a first-conductivity-type semiconductor layer 142a, a second-conductivity-type semiconductor layer 142b, and an active layer between the first-conductivity-type semiconductor layer 142a and the second-conductivity-type semiconductor layer 142b. The curved surface of the circular light emitting cell C may provide smooth light emission effects.

As illustrated in FIG. 15B, light emitting cells C with a parallelogrammic section are arrayed on a substrate 141. The parallelogrammic light emitting cell C has a first-conductivity-type semiconductor layer 152a, a second-conductivity-type semiconductor layer 152b, and an active layer between the first-conductivity-type semiconductor layer 152a and the second-conductivity-type semiconductor layer 152b.

As illustrated in FIG. 15C, light emitting cells C with a hexagonal section are arrayed on a substrate 141. The hexagonal light emitting cell C has a first-conductivity-type semiconductor layer 162a, a second-conductivity-type semiconductor layer 162b, and an active layer between the first-conductivity-type semiconductor layer 162a and the second-conductivity-type semiconductor layer 162b.

By changing the side shape of the light emitting cells of various polygonal structures illustrated in FIGS. 15B and 15C, the light emission effect can be improved and various array structures of the light emitting cells can be implemented.

FIGS. 16A through 16F are cross-sectional views illustrating a process for fabricating a multi-cell array semiconductor light emitting device according to an exemplary embodiment of the present invention.

Figure 16A:
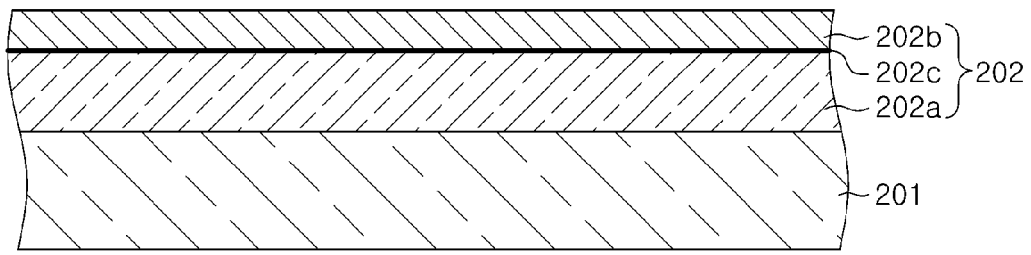
FIGS. 16A through 16F are cross-sectional views illustrating a process for fabricating a multi-cell array semiconductor light emitting device according to an exemplary embodiment of the present invention.

Referring to FIG. 16A, a semiconductor multilayer structure 202 for light emission is formed on the top surface of a substrate 201. That is, a first-conductivity-type semiconductor layer 202a, an active layer 202c, and a second-conductivity-type semiconductor layer 202b are sequentially formed on the substrate 201.

The substrate 201 may be an insulative substrate such as a sapphire substrate; however, the present invention is not limited thereto. For example, the substrate 201 may be a conductive substrate. If a conductive substrate is used as the substrate 201, because an electrode of the light emitting cell is connected by the conductive substrate, another electrode with an opposite polarity thereto may be interconnected by forming an interconnection on the top surface of the cell.

Figure 16B:
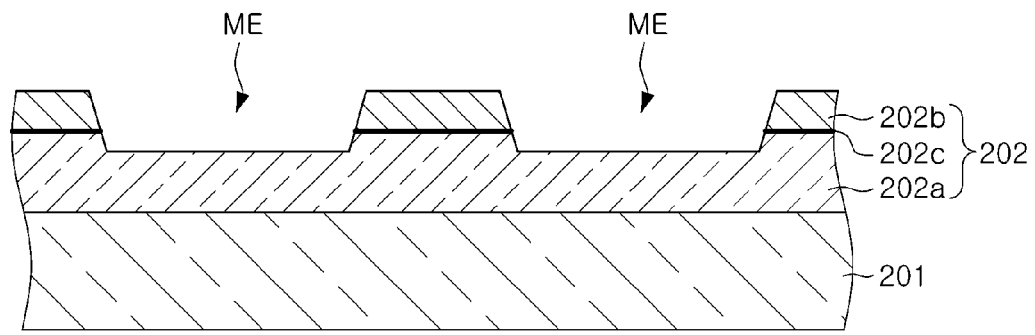

Referring to FIG. 16B, a mesa etching process for primary isolation is performed to selectively remove the second-conductivity-type semiconductor layer 202b, the active layer 202c, and a portion of the first-conductivity-type semiconductor layer 202a, thereby exposing the first-conductivity-type semiconductor layer region.

In this process, the mesa etching region ME includes an isolation region IE and a region where a first electrode will be formed.

Figure 16C:
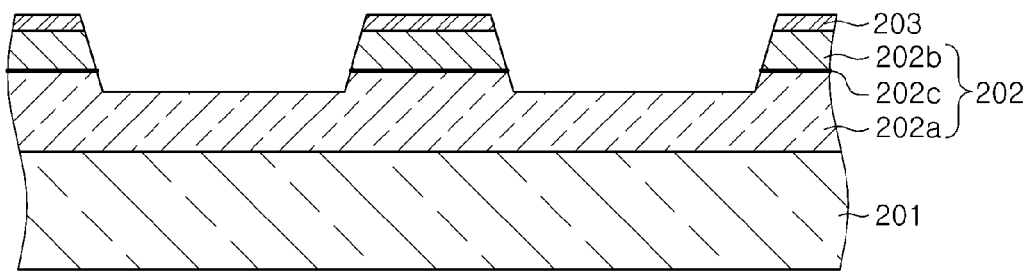
Figure 16D:
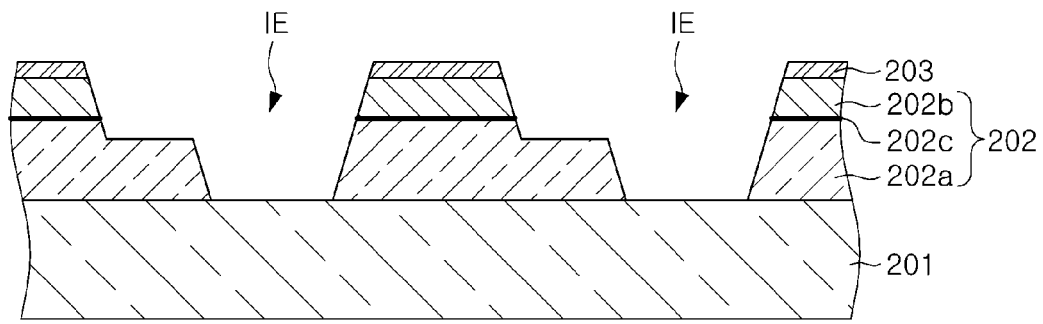

Referring to FIG. 16C, a transparent electrode 203 is formed on the second-conductivity-type semiconductor layer 202b. Referring to FIG. 16D, a complete isolation process is performed to form an isolation region IE exposing the surface of the substrate 201, in order to obtain a plurality of light emitting cells.

The processes of FIGS. 16B to 16D may vary according to embodiments. For example, although it has been described that the completion isolation process is performed after the mesa etching process, the mesa etching process may be performed separately after performing the completion isolation process.

Also, the transparent electrode forming process may be omitted, or the mesa etching process may be performed after the transparent electrode forming process.

Figure 16E:
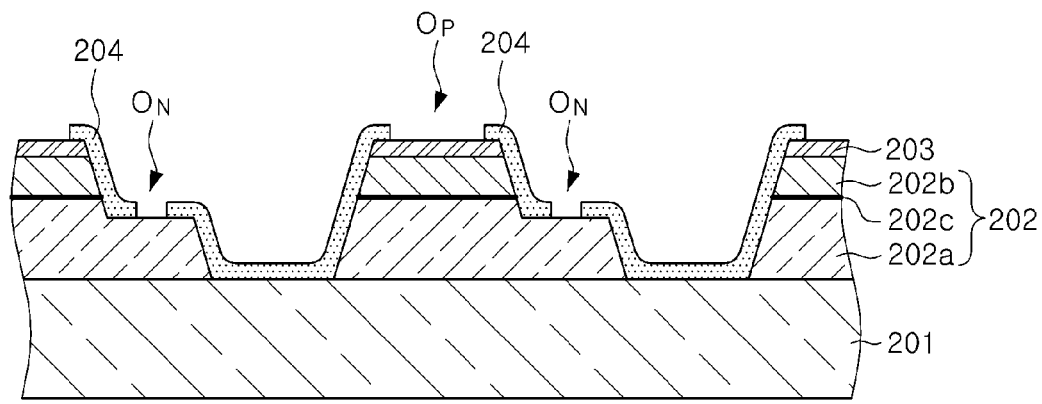

Referring to FIG. 16E, an insulating layer 204 is formed, and open regions $O_N$ and $O_P$ are formed to selectively expose the first-conductivity-type semiconductor layer 202a and the second-conductivity-type semiconductor layer 202b for connection with a connection part.

Figure 16F:
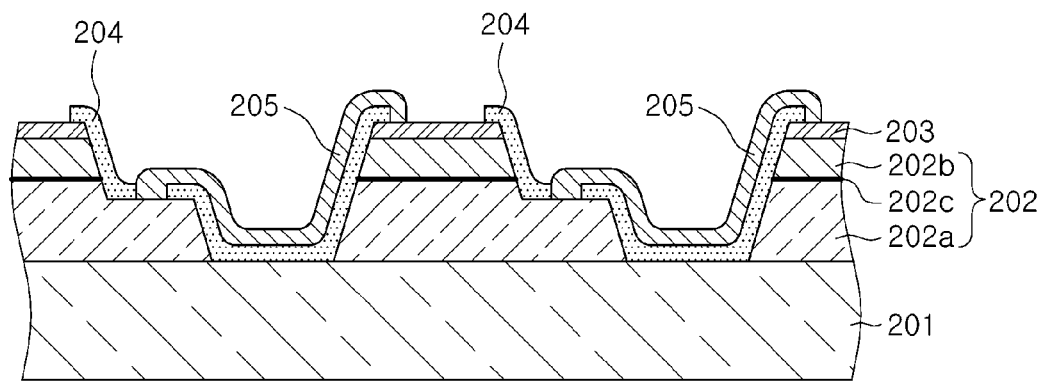

Referring to FIG. 16F, a connection part 205 for interconnection is formed. For a series connection structure, the connection part 205 may be formed to connect the first-conductivity-type semiconductor layer 202a and the second-conductivity-type semiconductor layer 202b.

Finally, the connection part related to the chip determined to be defective in the test process of the light emitting cells may be opened like the aforesaid embodiment.

The multi-chip array semiconductor light emitting device according to the embodiments of the present invention may be used as a chip in a module including a device having an electrode part like a printed circuit board. Also, the aforesaid light emitting devices and light emitting modules may be implemented as an illumination apparatus including a driving unit.

Figure 17A:
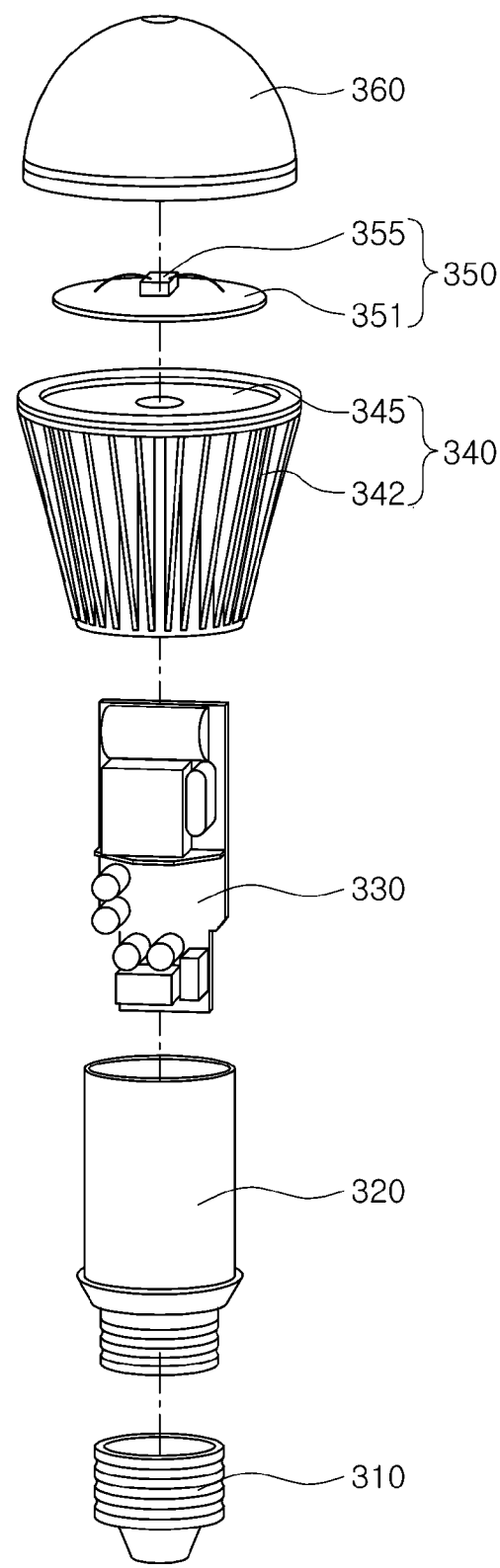
FIGS. 17A and 17B are respectively an exploded perspective view and a schematic perspective view of an illumination apparatus including a multi-cell array semiconductor light emitting device according to an embodiment of the present invention.
Figure 17B:
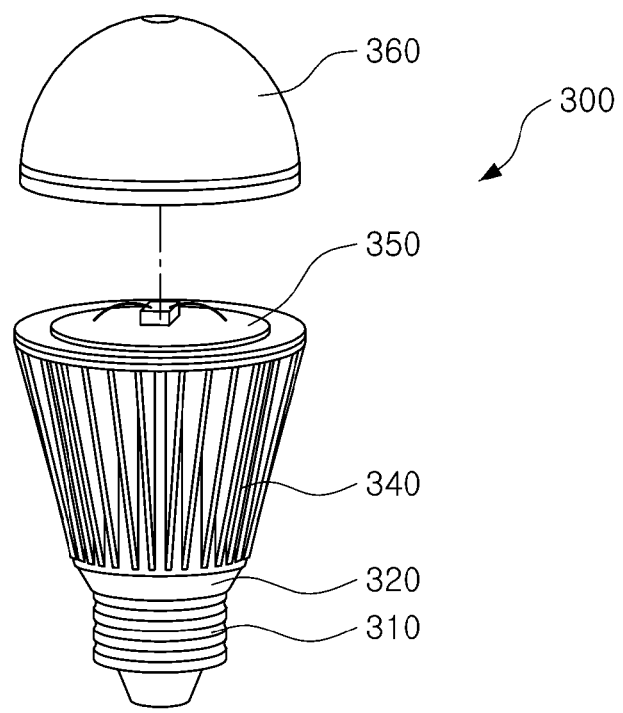

FIGS. 17A and 17B are respectively an exploded perspective view and a schematic perspective view of an illumination apparatus including a multi-cell array semiconductor light emitting device according to an embodiment of the present invention.

FIGS. 17A and 17B illustrate a bulb-type lamp as an example of the illumination apparatus according to the present invention.

Referring to FIGS. 17A and 17B, an illumination apparatus 300 includes a light emitting module 350, a driving unit 330, and an external connection unit 310. The illumination apparatus 300 may further include external structures such as an outer housing 340 and an inner housing 320.

The light emitting module 350 may include a multi-chip array light emitting device 355 and a circuit board 351 mounting the multi-chip array light emitting device 355. In this embodiment, one multi-chip array light emitting device 355 is mounted on the circuit board 351; however, the present invention is not limited thereto. That is, a plurality of multi-chip array light emitting devices may be mounted on the circuit board 351.

The light emitting module 350 may include the outer housing 340 acting as a heat emission part. The outer housing 340 may include a heat dissipation plate 345 that is directly connected to the light emitting module 350 to improve the heat dissipation effect. Also, the illumination apparatus 300 may include a cover part 360 that is mounted on the light emitting module 350 and has the shape of a convex lens.

The driving unit 330 is mounted in the inner housing 320 and is connected to the external connection unit 310 to receive power from an external power supply unit.

Also, the driving unit 330 is configured to drive the multi-chip array light emitting device 355 of the light emitting module by converting the received power into a current and providing the same to the multi-chip array light emitting device 355. For example, the driving unit 330 may include an AC-DC converter or a rectifier circuit.

The aforesaid light emitting devices and light emitting modules may be used in various apparatuses such as indoor illumination apparatuses (e.g., lamps), outdoor illumination apparatuses (e.g., street lamps and signboards), and traffic illumination apparatuses (e.g., headlamps and tail lamps for vehicles such as cars, airplanes and ships). The illumination apparatus may further include a heat dissipation member and/or a reflection plate.

As described above, the present invention implements a large-area semiconductor multilayer structure, forms a plurality of light emitting cells corresponding to sub-chips through typical isolation processes (e.g., a complete isolation process and a mesa etching process for partial isolation), connects the light emitting cells by metal electrodes rather than by wire, and drives the connected structure like a single chip, thereby overcoming the problems caused when the chips are connected by wire (e.g., a complex fabrication process, a wire open failure, and a difficulty in miniaturization).

Also, when a plurality of light emitting cells are connected by metal wire to implement a series-parallel connection, even when a defect occurs in a portion of the light emitting cells corresponding to sub-chips, the present invention opens the connection part related to the defective light emitting cell, thereby making it possible to use the semiconductor light emitting device without treating the entire chip as a defective chip.

Also, when it has an array based on a parallel connection or an improved series-parallel connection, the present invention opens the related connection part, thus reducing the number of unusable light emitting cells when removing a defective light emitting cell.

Also, the present invention uses a connection structure capable of providing a current distribution in the entire light emitting cells when removing a defective light emitting cell, thus solving the problem of a non-uniform light emission distribution according to locations.

While the present invention has been shown and described in connection with the exemplary embodiments, it will be apparent to those skilled in the art that modifications and variations can be made without departing from the spirit and scope of the invention as defined by the appended claims.

What is claimed is:
1. A semiconductor light emitting device comprising:
    a substrate;
    a plurality of light emitting cells disposed on a top surface of the substrate, the light emitting cells each having a first-conductivity-type semiconductor layer, an active layer, and a second-conductivity-type semiconductor layer formed sequentially on the top surface of the substrate, wherein a region between the light emitting cells is defined as an isolation region removed to at least the active layer;
    a plurality of connection parts formed on the substrate with the light emitting cells formed thereon to connect the light emitting cells in a parallel or series-parallel configuration; and
    an insulation layer formed on the surface of the light emitting cells to prevent an undesired connection between the connection parts and the light emitting cells,
    wherein the light emitting cells comprise at least one defective light emitting cell, and at least one of the connection parts related to the defective light emitting cell is disconnected,
    wherein the light emitting cells are arrayed in a plurality of columns each having two or more light emitting cells, and
    the connection parts comprise:
        a first connection part connected to the first-conductivity-type semiconductor layer of a light emitting cell located at one end of each column;
        a second connection part connected to the second-conductivity-type semiconductor layer of a light emitting cell located at an other end of each column; and further comprising:
    a plurality of first bonding pads disposed directly on the substrate and electrically connected to the first-conductivity-type semiconductor layer of the light emitting cells located at the one end of each column through the first connection part; and
    a plurality of second bonding pads disposed directly on the substrate and electrically connected to the second-conductivity-type semiconductor layer of the light emitting cells located at the other end of each column through the second connection part.

2. The semiconductor light emitting device of claim 1, wherein
    the connection parts further comprise:
        an interconnection part formed to connect the light emitting cells of each column in series to each other between the first connection part and the second connection part.

3. The semiconductor light emitting device of claim 1, wherein the connection parts further comprise an intermediate connection part formed to connect the interconnection part of at least a portion of the columns in a row direction.

4. The semiconductor light emitting device of claim 3, wherein
    the light emitting cells are M×N light emitting cells arrayed in M rows and N columns on the substrate, M and N being integers equal to or greater than 2; and
    the light emitting cells in each column are formed such that opposite polarities thereof face each other.

5. The semiconductor light emitting device of claim 4, wherein the intermediate connection part comprises an intermediate connection part formed to connect all of the N columns.

6. The semiconductor light emitting device of claim 4, wherein the intermediate connection part comprises a plurality of intermediate connection parts formed in one row direction to connect a portion of the N columns.

7. The semiconductor light emitting device of claim 4, wherein the intermediate connection part comprises a plurality of intermediate connection parts formed along a plurality of different row directions.

8. The semiconductor light emitting device of claim 1, wherein the columns have a same number of light emitting cells disposed therein.

9. The semiconductor light emitting device of claim 1, wherein the connection parts further comprise:
    a plurality of first interconnection parts connecting the first connection part and the first-conductivity-type semiconductor layer of each light emitting cell; and
    a plurality of second interconnection parts connecting the second connection part and the second-conductivity-type semiconductor layer of each light emitting cell.

10. The semiconductor light emitting device of claim 9, wherein,
    the light emitting cells are M×N light emitting cells arrayed in M rows and N columns on the substrate, M and N being integers equal to or greater than 2; and
    the light emitting cells in each column arc formed such that the electrodes of a same polarity face each other.

11. The semiconductor light emitting device of claim 10, wherein
    the first connection part comprises at least one first intermediate connection part formed between adjacent rows and connected to the semiconductor layers of a same conductivity type of the light emitting cells located at both sides opposite to each other; and the second connection part comprises at least one second intermediate connection part formed between the adjacent rows and connected to the semiconductor layers of the same conductivity type of the light emitting cells located at both sides opposite to each other.

12. The semiconductor light emitting device of claim 1, wherein the light emitting cells are arrayed In M rows and N columns, M and N being integers equal to or greater than 4;

M light emitting cells located in each column are divided into a plurality of groups each having two or more light emitting cells connected in series to each other, and the light emitting cells of the groups are formed such that the electrodes of a same polarity face each other in the light emitting cells of adjacent groups; and the connection parts comprise series interconnection parts formed to connect the light emitting cells of the groups in series to each other.

13. The semiconductor light emitting device of claim 12, wherein the connection parts further comprise:

a plurality of first interconnection parts connecting the first connection part and the first-conductivity-type semiconductor layer of each light emitting cell; and a plurality of second interconnection parts connecting the second connection part and the second-conductivity-type semiconductor layer of each light emitting cell.

14. The semiconductor light emitting device of claim 13, wherein, the first connection part comprises at least one first intermediate connection part formed between adjacent rows and connected to the semiconductor layers of a same conductivity type of light emitting cells located at both sides opposite to each other; and the second connection part comprises at least one second intermediate connection part formed between the adjacent rows and connected to the semiconductor layers of the same conductivity type of the light emitting cells located at both sides opposite to each other.

15. The semiconductor light emitting device of claim 12, wherein the groups include a same number of light emitting cells.

16. The semiconductor light emitting device of claim 1, wherein the isolation region comprises a region exposing the substrate.

17. The semiconductor light emitting device of claim 1, wherein the isolation region comprises a region exposing the first-conductivity-type semiconductor layer.

18. The semiconductor light emitting device of claim 1, wherein the insulation layer is provided as a passivation layer formed on side surfaces of the light emitting cells.

19. The semiconductor light emitting device of claim 1, wherein the light emitting cells have a polygonal, circular or parallelogrammic section.

20. A semiconductor light emitting device comprising:

a substrate;

a plurality of light emitting cells disposed on a top surface of the substrate, the light emitting cells each having a first-conductivity-type semiconductor layer, an active layer, and a second-conductivity-type semiconductor layer formed sequentially on the top surface of the substrate, the light emitting cells being arrayed in a plurality of columns having two or more light emitting cells;

a plurality of connection parts formed on the substrate with the light emitting cells formed thereon to connect the light emitting cells in a series-parallel configuration; and an insulation layer formed on a surface of the light emitting cells to prevent an undesired connection between the connection parts and the light emitting cells, wherein the connection parts comprise:

a first connection part connected to the first-conductivity-type semiconductor layer of a light emitting cell located at one end of each column;

a second connection part connected to the second-conductivity-type semiconductor layer of a light emitting cell located at an other end of each column;

an interconnection part formed to connect the light emitting cells of each column in series to each other between the first connection part and the second connection part; and an intermediate connection part formed to connect the interconnection part of at least a portion of the columns in a row direction; and further comprising:

a plurality of first bonding pads disposed directly on the substrate and electrically connected to the first-conductivity-type semiconductor layer of the light emitting cells through the first connection part; and a plurality of second bonding pads disposed directly on the substrate and electrically connected to the second-conductivity-type semiconductor layer of the light emitting cells through the second connection part.

21. The semiconductor light emitting device of claim 20, wherein the light emitting cells are M×N light emitting cells arrayed in M rows and N columns on the substrate, M and N being integers equal to or greater than 2; and the light emitting cells in each column are formed such that opposite polarities thereof face each other.

22. The semiconductor light emitting device of claim 21, wherein the intermediate connection part comprises an intermediate connection part formed to connect all of the N columns.

23. The semiconductor light emitting device of claim 21, wherein the intermediate connection part comprises a plurality of intermediate connection parts formed in one row direction to connect a portion of the N columns.

24. The semiconductor light emitting device of claim 21, wherein the intermediate connection part comprises a plurality of intermediate connection parts formed along a plurality of different row directions.

25. The semiconductor light emitting device of claim 20, wherein the columns have a same number of light emitting cells disposed therein.

* * * * *